(12) United States Patent
Tobita

(10) Patent No.: US 8,593,204 B2
(45) Date of Patent: Nov. 26, 2013

(54) AMPLITUDE CONVERSION CIRCUIT

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 25 days.

(21) Appl. No.: 12/843,311

(22) Filed: Jul. 26, 2010

(65) Prior Publication Data

US 2011/0025399 A1     Feb. 3, 2011

(30) Foreign Application Priority Data

Aug. 3, 2009 (JP) ................................. 2009-180346

(51) Int. Cl.
*H03K 5/00* (2006.01)

(52) U.S. Cl.
USPC ................. 327/333; 326/62; 326/80

(58) Field of Classification Search
USPC .................. 326/62–63, 80–81; 327/306, 333
See application file for complete search history.

(56) References Cited

U.S. PATENT DOCUMENTS

| | | | | |
|---|---|---|---|---|
| 3,710,271 A | * | 1/1973 | Putnam | 326/88 |
| 6,980,194 B2 | * | 12/2005 | Tobita | 345/100 |
| 7,564,289 B2 | * | 7/2009 | Imura | 327/333 |
| 7,567,112 B2 | * | 7/2009 | Shen | 327/333 |
| 7,812,660 B2 | * | 10/2010 | Tamura | 327/333 |
| 7,868,658 B1 | * | 1/2011 | Miao | 326/68 |
| 7,893,732 B2 | * | 2/2011 | Tobita | 327/108 |
| 7,902,870 B1 | * | 3/2011 | Jiang | 326/68 |
| 8,018,266 B2 | * | 9/2011 | Chan | 327/333 |
| 2001/0022520 A1 | | 9/2001 | Matsumoto | |
| 2002/0093362 A1 | | 7/2002 | Matsumoto | |

FOREIGN PATENT DOCUMENTS

| | | |
|---|---|---|
| JP | 2001-320268 | 11/2001 |
| JP | 2008-022539 | 1/2008 |

OTHER PUBLICATIONS

Office Action issued Jul. 9, 2013, in Japanese patent Application No. 2009-180346 with partial English translation.

* cited by examiner

*Primary Examiner* — Dinh T. Le
(74) *Attorney, Agent, or Firm* — Oblon, Spivak, McClelland, Maier & Neustadt, L.L.P.

(57) ABSTRACT

In an amplitude conversion circuit that converts an input signal having a small amplitude into an output signal having a large amplitude, the input signal is supplied to a gate of a transistor that discharges an output terminal through a capacitance element. A charging/discharging circuit causes a gate voltage of the transistor to be substantially equal to a threshold voltage during an inactive period of the input signal.

20 Claims, 20 Drawing Sheets

F I G. 1
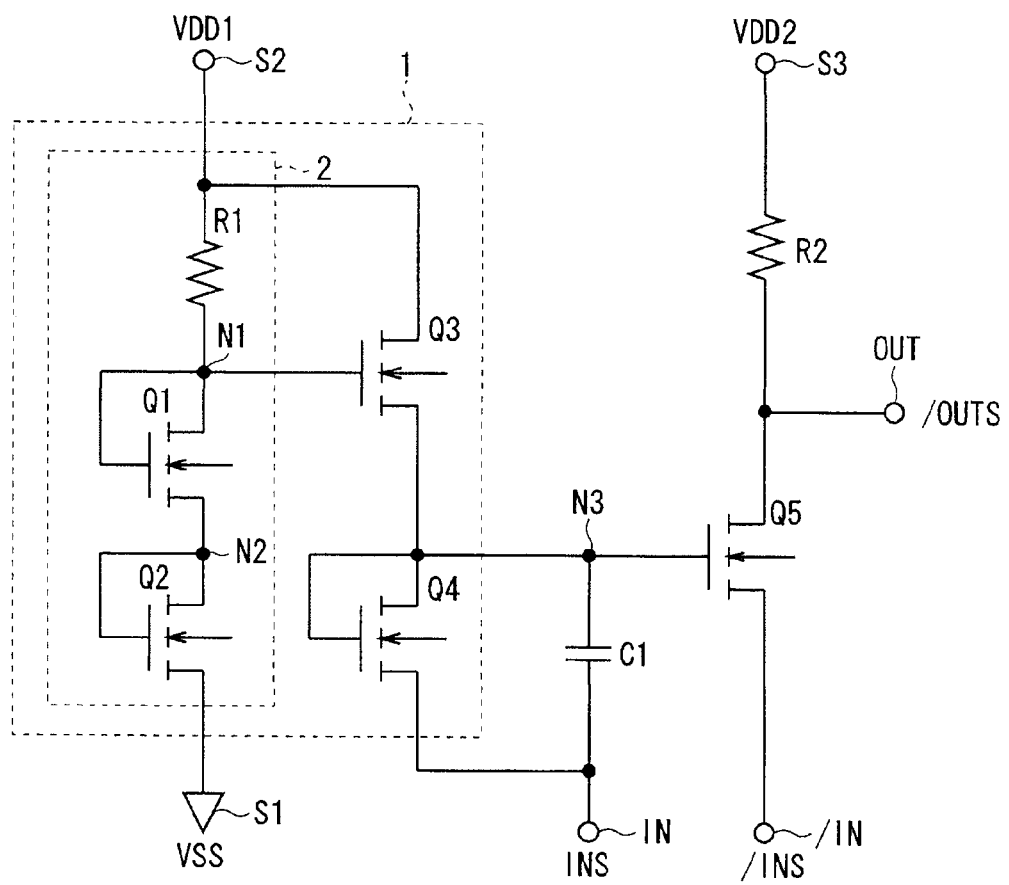

F I G . 7
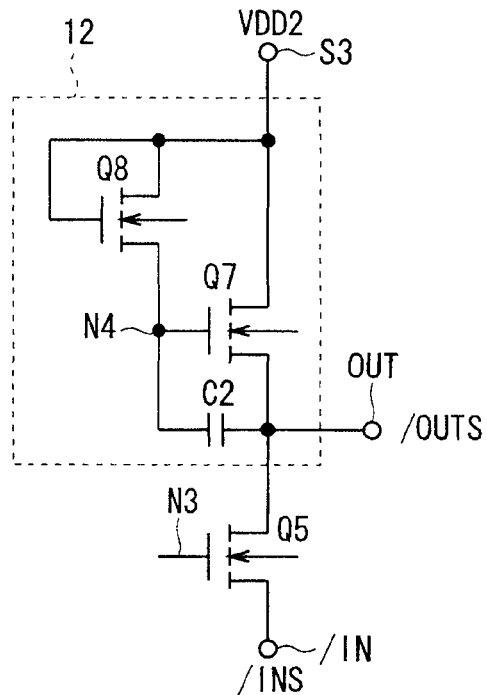
F I G . 8
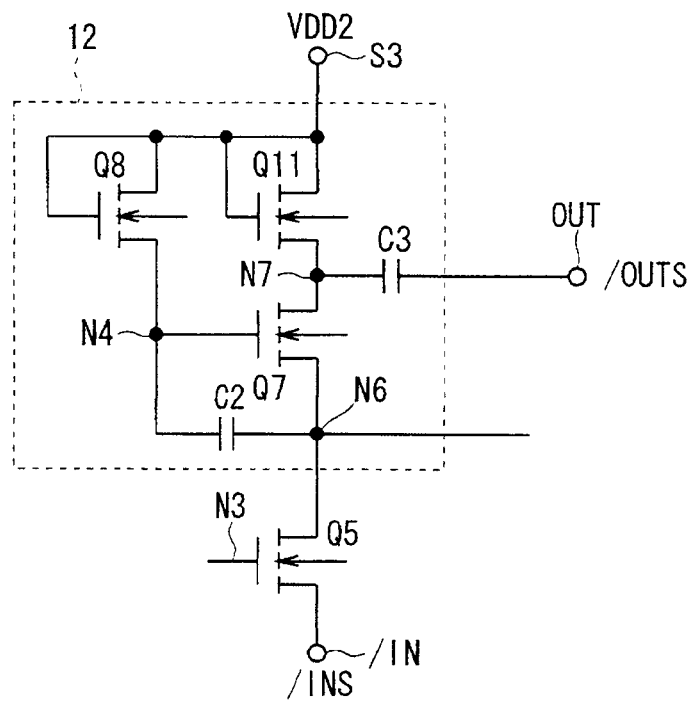

F I G. 1 6
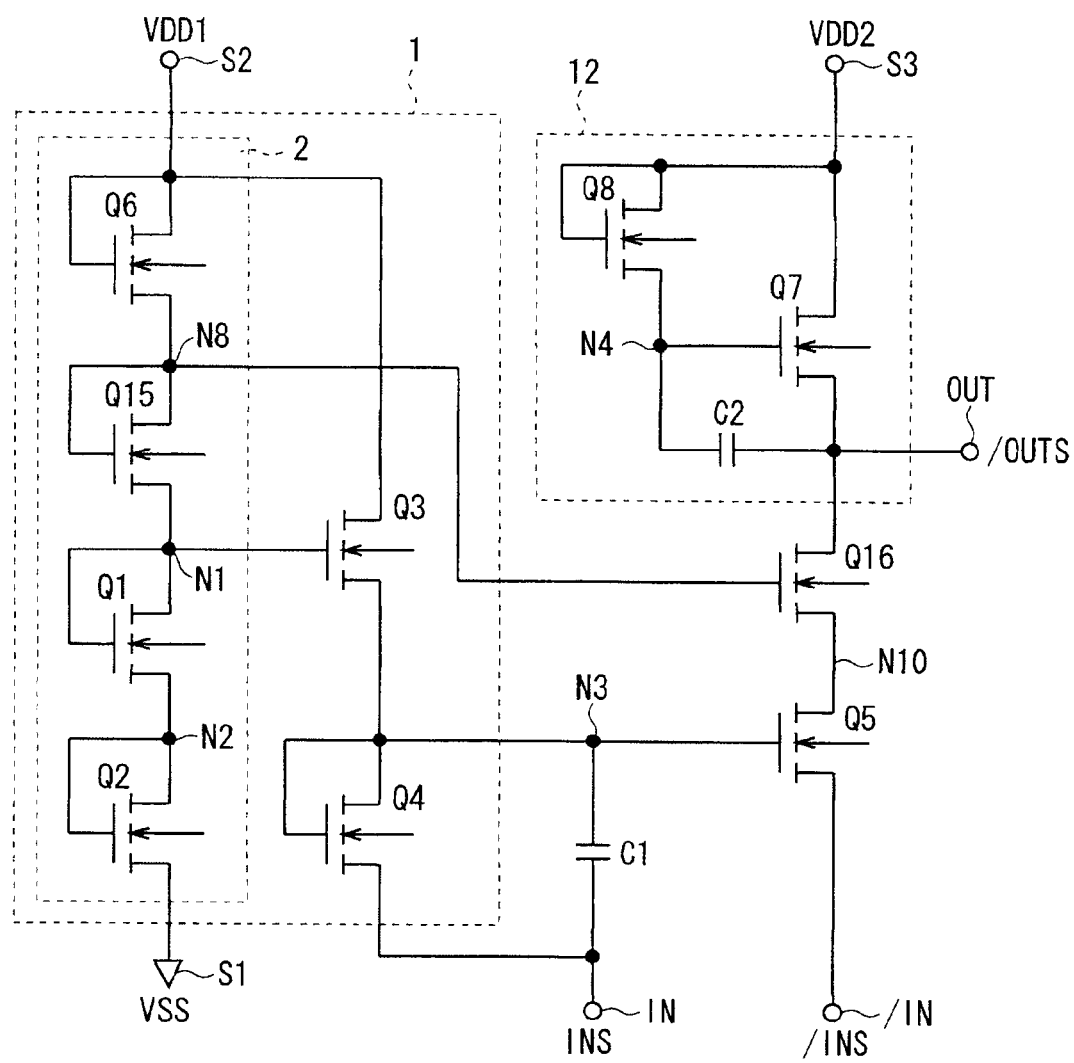

F I G . 1 7
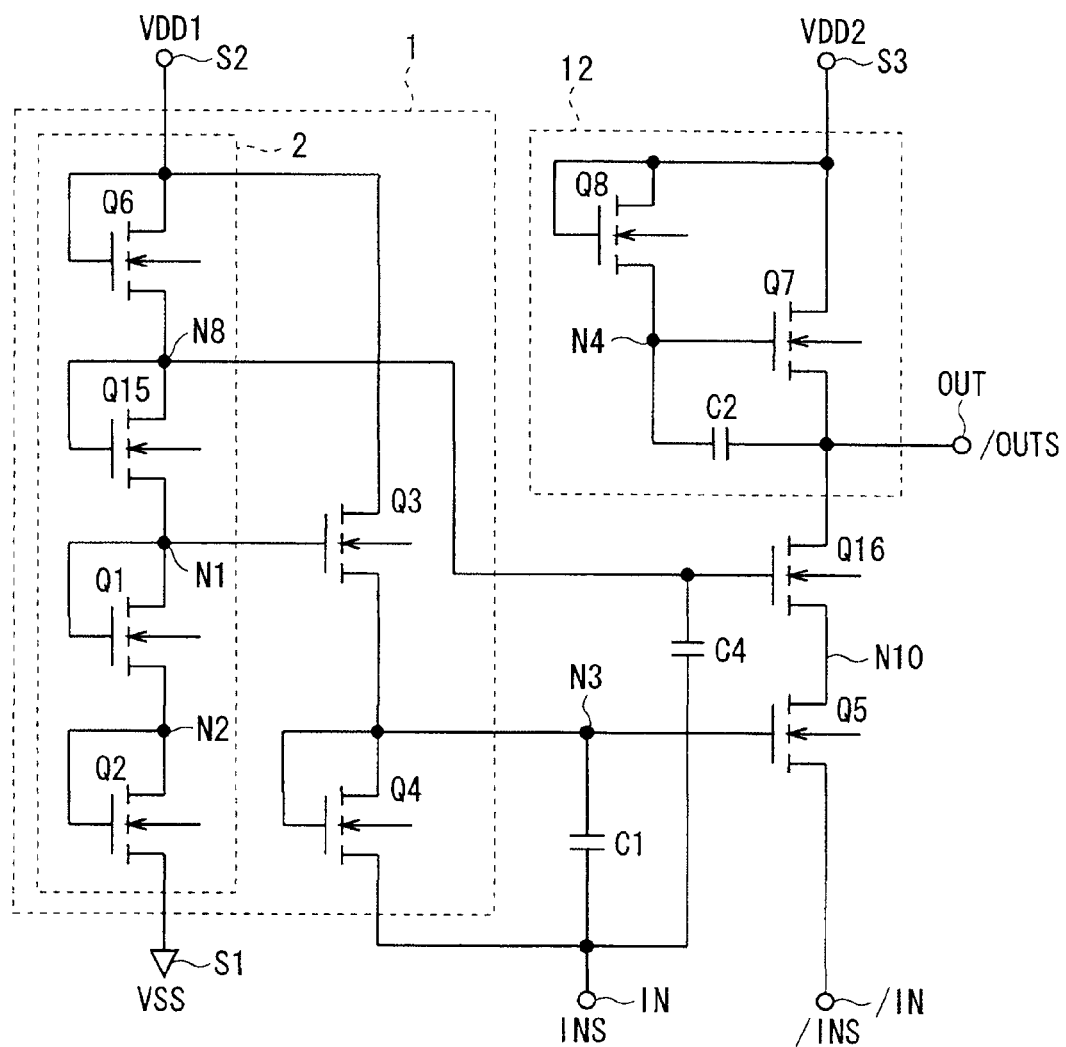

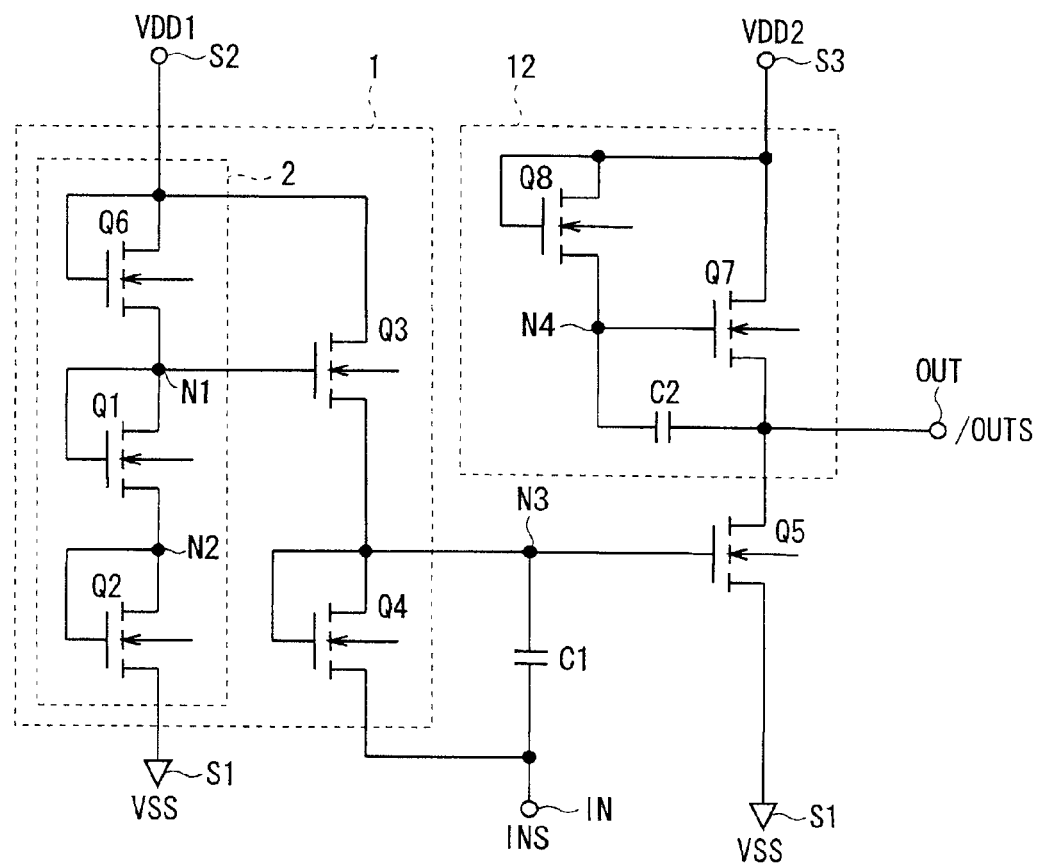
F I G . 1 8

F I G. 1 9
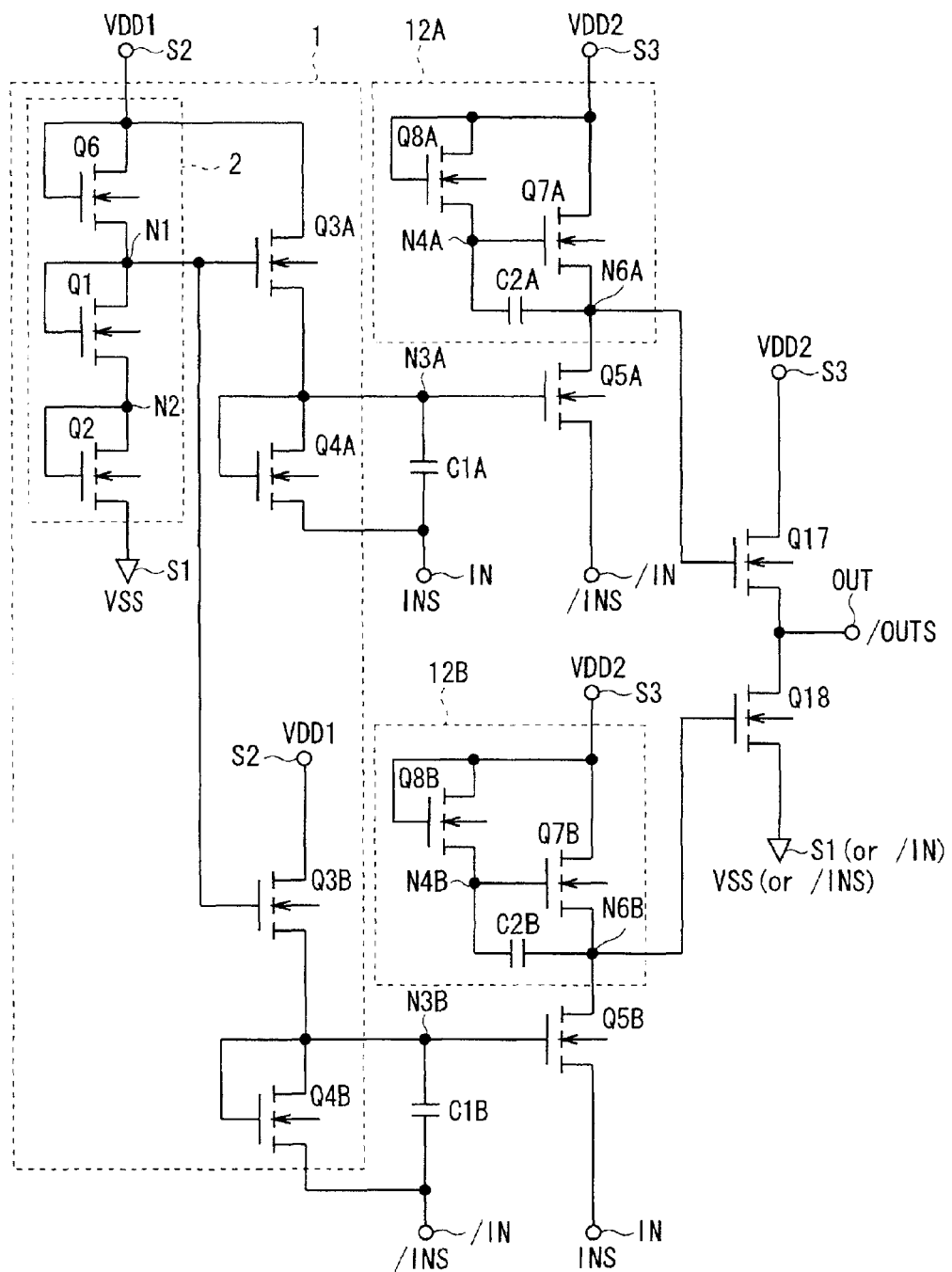

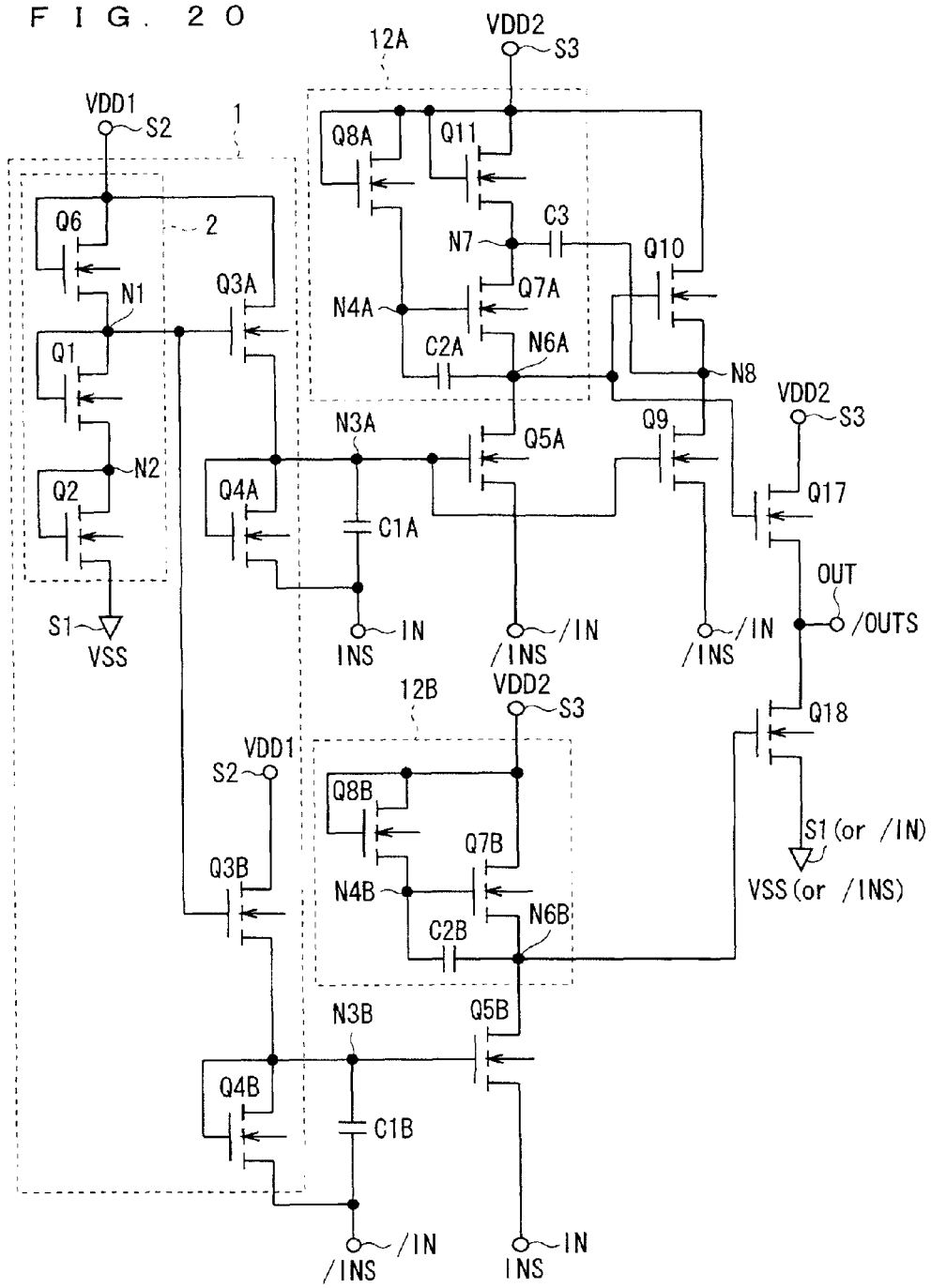
F I G . 2 0

AMPLITUDE CONVERSION CIRCUIT

BACKGROUND OF THE INVENTION

1. Field of the Invention

The present invention relates to an amplitude conversion circuit for converting an amplitude of a signal, and more particularly, to an amplitude conversion circuit including transistors that have the same conductivity type.

2. Description of the Background Art

There is widely known an amplitude conversion circuit (level converting circuit) for converting a voltage level and an amplitude of a signal. For example, Japanese Patent Application Laid-Open No. 2005-12356 discloses the level converting circuit including transistors that have the same conductivity type. The transistors of a single conductivity type are used in this manner, which leads to a simplification of the manufacturing process as well as a cost reduction.

For example, in the level converting circuit of FIG. 1 of Japanese Patent Application Laid-Open No. 2005-12356, an input signal IN is supplied to a gate of an input transistor 6 through capacitive coupling of a capacitance element Cc. A source of the input transistor 6 is fixed at a constant power supply potential −VL, and thus a gate-source voltage of the input transistor 6 changes with the amplitude equal to that of the input signal IN. Further, in the level converting circuit, a resistance element 7 is connected between the gate and the source of the input transistor 6, whereby the gate-source voltage becomes zero when the input signal IN is at the inactive level in a steady state. Accordingly, in the level converting circuit, the amplitude of the input signal IN needs to be equal to or larger than a threshold voltage of the input transistor 6 in order that the input transistor 6 turns on/off in accordance with a level of the input signal IN.

Nowadays, display devices have come into use, which have a configuration in which pixels composed of display elements such as liquid crystal elements and organic electroluminescence (EL) elements and drive circuits thereof are formed on the same insulating substrate, to thereby achieve a cost reduction of a display device. In the formation of the transistors used in the above-mentioned pixels and drive circuits, a manufacturing process for, for example, low temperature poly-silicon or amorphous silicon is used. A threshold voltage of a transistor formed through the above-mentioned manufacturing process is approximately 3 V to 5 V, including variations. On the other hand, a control signal input to the display device is generated by a semiconductor integrated circuit, and a level thereof is typically from 3 V to 3.3 V.

When the threshold voltage of the transistor used in the display device is equal to an amplitude of the control signal as described above, it is difficult to cause the drive circuit to operate in response to a control signal thereof. Therefore, an amplitude conversion circuit composed of a semiconductor integrated circuit is provided in a conventional display device, which amplifies control signals. This enables normal operation of the drive circuit, but a cost increase of a display device is caused due to the addition of an amplitude conversion circuit composed of a semiconductor integrated circuit.

In the case of the amplitude conversion circuit configured with only transistors of a single conductivity type, such as the level converting circuit of Japanese Patent Application Laid-Open No. 2005-12356, costs may be reduced because the amplitude conversion circuit can be formed on the same insulating substrate as the pixels and drive circuits. However, an input signal having a threshold voltage of its input transistor or higher voltage is required, which makes it difficult to use the amplification conversion circuit for amplifying control signals generated by the semiconductor integrated circuit.

SUMMARY OF THE INVENTION

An object of the present invention is to provide an amplitude conversion circuit capable of operating normally even in a case where an amplitude of an input signal is smaller than a threshold voltage of an input transistor.

An amplitude conversion circuit according to the present invention converts a first signal into a second signal having a larger amplitude than that of the first signal. The amplitude conversion circuit includes a first input terminal receiving the first signal, an output terminal for outputting the second signal, a first current drive element connected between a first power supply terminal and the output terminal, a first transistor discharging the output terminal, and a drive circuit driving the first transistor in response to the first signal. The drive circuit level-shifts the first signal by a level substantially equal to a threshold voltage of the first transistor, and supplies the level-shifted first signal to a first node to which a control electrode of the first transistor is connected.

According to the amplitude conversion circuit of the present invention, an amplitude conversion circuit including a semiconductor integrated circuit is not required outside an insulating substrate, and thus a reduction in manufacturing cost is achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram of an amplitude conversion circuit according to a first preferred embodiment;

FIGS. 6 to 10 are circuit diagrams of an output stage of an amplitude conversion circuit according to a second modification of the first preferred embodiment;

FIG. 16 is a circuit diagram of an amplitude conversion circuit according to an eighth modification of the first preferred embodiment;

FIG. 17 is a circuit diagram of an amplitude conversion circuit according to a ninth modification of the first preferred embodiment;

FIG. 18 is a circuit diagram of an amplitude conversion circuit according to a tenth modification of the first preferred embodiment;

FIG. 19 is a circuit diagram of an amplitude conversion circuit according to a second preferred embodiment;

FIG. 20 is a circuit diagram of an amplitude conversion circuit according to a modification of the second preferred embodiment;

DESCRIPTION OF THE PREFERRED EMBODIMENTS

Figure 2:
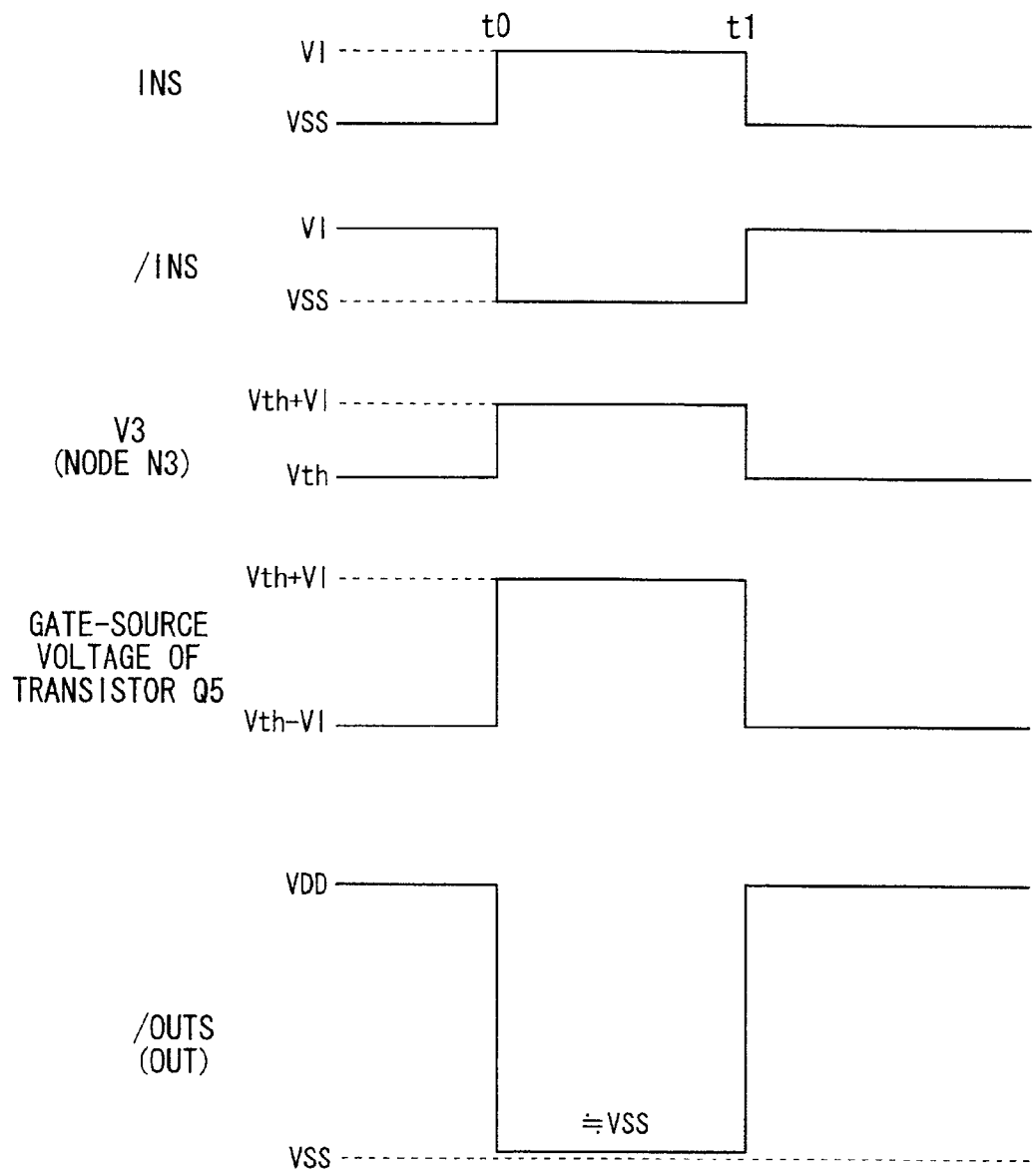
FIG. 2 is a signal waveform diagram showing an operation of the amplitude conversion circuit according to the first preferred embodiment.

Hereinafter, preferred embodiments of the present invention are described with reference to the drawings. For avoiding redundant duplications, elements having similar or corresponding functions are denoted by like reference numerals in the respective drawings.

Transistors used in the respective preferred embodiments are insulated gate field effect transistors. In the insulated gate field effect transistor, the electric conductivity between a drain region and a source region in a semiconductor layer is controlled by an electric field in a gate insulating film. As a material for the semiconductor layer in which the drain region and the source region are formed, for example, an organic semiconductor such as poly-silicon, amorphous silicon and pentacene, or an oxide semiconductor such as single crystal silicon and In—Ga—Zn—O (IGZO) is used.

As widely known, a transistor is an element including at least three electrodes of a control electrode (in a narrow sense, gate (electrode)), one current electrode (in a narrow sense, drain (electrode) or source (electrode)) and the other current electrode (in a narrow sense, source (electrode) or drain (electrode)). The transistor functions as a switching element in which a channel is formed between the drain and the source upon application of a predetermined voltage on the gate. The drain and source of the transistor basically have the same structure, which are conversely referred to depending on applied voltage conditions. For example, in a case of an N-type transistor, an electrode having relatively high potential (hereinafter, also referred to as "level") and an electrode having relatively low potential are referred to as a drain and a source, respectively (which is opposite in a case of a P-type transistor).

Unless otherwise specifically noted, those transistors may be ones formed on a semiconductor substrate or thin film transistors (TFTs) formed on an insulating substrate such as glass. The substrate on which the transistors are formed may be a single crystal substrate or an insulating substrate such as SOI, glass and resin.

An amplitude conversion circuit according to the present invention is configured with transistors having the same conductivity type, and such transistors include enhancement type (normally-off) transistors and depletion type (normally-on) transistors. The depletion type transistor is used as a current drive element not as a switching element. Hereinafter, unless otherwise specifically noted, the transistor refers to the enhancement type transistor.

An N-type transistor is brought into an active state (turned on, conducted) when a gate-source voltage is at a high (H) level higher than a threshold voltage of the transistor and is brought into an inactive state (turned off, not conducted) when the gate-source voltage is at a low (L) level lower than the threshold voltage. Accordingly, in a circuit using N-type transistors, the H level and the L level of a signal are referred to as an "active level" and an "inactive level", respectively. In the circuit configured with N-type transistors, an inactive level changes to an active level when respective nodes are charged to the H level, while the active level changes to the inactive level when the respective nodes are discharged to the L level.

In contrast, a P-type transistor is brought into an active state (turned on, conducted) at the L level at which a gate-source voltage is lower than a threshold voltage (negative value with a source being a reference) of the transistor and is brought into an inactive state (turned off, not conducted) at the H level at which the gate-source voltage is higher than the threshold voltage. Accordingly, in a circuit using P-type transistors, the L level and the H level of a signal are referred to as an "active level" and an "inactive level", respectively. In the circuit configured with P-type transistors, a relationship between charging and discharging is opposite to that of the case of the N-type transistor such that an inactive level changes to an active level when respective nodes are charged to the L level, while the active level changes to the inactive level when the respective nodes are discharged to the H level.

Herein, a change from the inactive level to the active level and a change from the active level to the inactive level are defined as "pull-up" and "pull-down", respectively. That is, in a circuit using N-type transistors, a change from the L level to the H level and a change from the H level to the L level are defined as "pull-up" and "pull-down", respectively. On the other hand, in a circuit using P-type transistors, a change from the H level to the L level and a change from the L level to the H level are defined as "pull-up" and "pull-down", respectively.

Further, herein, "connection" between two elements, between two nodes, or between one element and one node is described as one including a state equivalent to a state in which while they are connected via other element (such as element and switch), substantially, they are directly connected to each other. For example, even if two elements are connected via a switch, in a case where they are capable of functioning in the same manner as the case where they are directly connected to each other, those two elements are expressed to be "connected".

First Preferred Embodiment

FIG. 1 is a circuit diagram showing a configuration example of an amplitude conversion circuit 10 according to a first preferred embodiment. In this preferred embodiment, the amplitude conversion circuit 10 is configured with N-type TFTs. The following description is given assuming that threshold voltages of respective transistors excluding a depletion type transistor are equal to each other and that a value thereof is Vth.

As shown in FIG. 1, the amplitude conversion circuit 10 includes two input terminals IN and /IN. The input terminal IN is supplied with an input signal INS (first signal), while the input terminal /IN is supplied with an input signal /INS that is a complementary signal (complementary signal of the first signal) to the input signal INS. The amplitude conversion circuit 10 converts (amplifies) the input signals INS and /INS into output signals (second signals) having larger amplitudes compared with those input signals. The amplitude conversion circuit 10 outputs an output signal /OUTS of a waveform obtained by inverting and amplifying the input signal INS (in other words, waveform obtained by amplifying the input signal /INS) from the output terminal OUT.

A low-potential-side power supply potential (hereinafter, referred to as "low-side power supply potential") VSS is supplied to a first power supply terminal S1 (reference power supply terminal) of the amplitude conversion circuit 10, a high-potential-side power supply potential (hereinafter, referred to as "high-side power supply potential") VDD1 is supplied to a second power supply terminal S2 thereof, and a high-side power supply potential VDD2 is supplied to a third power supply terminal S3 thereof. For the sake of simplicity, in the following description, the low-side power supply potential VSS is regarded as a reference potential (=0 V) of the circuit, potentials of the high-side power supply potentials VDD1 and VDD2 are regarded to be equal to each other, and levels thereof are denoted by VDD (that is, VDD=VDD1=VDD2). The input signals INS and /INS are signals having a potential VI at the H level and a potential VSS at the L level. VSS is equal to zero, and thus amplitudes of the input signals INS and /INS are VI.

In order to clarify characteristics of the present invention, the description is given assuming that the amplitude VI of the input signals INS and /INS is a value equal to or smaller than a threshold value Vth of each transistor (VI≤Vth). This corresponds to the case where the input signals INS and /INS (VI is 3.0 V to 3.3 V) generated by a semiconductor integrated circuit are supplied to a circuit configured with transistors (Vth is 3 V to 5 V) formed of low temperature poly-silicon or amorphous silicon. Needless to say, the amplitude conversion circuit according to the present invention is also applicable to input signals INS and /INS where VI>Vth.

The amplitude conversion circuit 10 is composed of a resistance element R2 connected between the third power supply terminal S3 and the output terminal OUT, a transistor Q5 connected between the output terminal OUT and the input terminal /IN, a capacitance element C1 (boosting element) connected between a gate of the transistor Q5 and the input terminal IN, and a charging/discharging circuit 1. The transistor Q5 is an input transistor that has the gate supplied with the input signal INS through the capacitance element C1.

The transistor Q5 is set to have an on-resistance value much smaller than a resistance value of the resistance element R2 and constitutes a ratio circuit. Therefore, the output terminal OUT (output signal /OUTS) reaches the H level with the potential VDD when the transistor Q5 turns off. On the other hand, when the transistor Q5 turns on, the output terminal OUT reaches the L level with the potential determined in accordance with a ratio between the on-resistance value thereof and the resistance value of the resistance element R2.

The charging/discharging circuit 1 charges and discharges a node (defined as "node N3") to which the gate of the transistor Q5 is connected in accordance with a level change of the input signal INS. During the period (inactive period) where the input signal INS is at the L level, the charging/discharging circuit 1 sets the node N3 to have a voltage substantially equal to the threshold voltage Vth of the transistor Q5 based on the reference potential (VSS).

The charging/discharging circuit 1 is composed of a voltage generating circuit 2 that generates a predetermined voltage and transistors Q3 and Q4. The transistor Q3 is connected between the second power supply terminal S2 and the node N3 and has a gate (defined as "node N1") connected to an output end of the voltage generating circuit 2. The transistor Q4 is connected between the node N3 and the input terminal IN and has a gate connected to the node N3. That is, the transistor Q4 constitutes a diode element. Note that while the transistor Q3 performs a source-follower operation, on the conditions for enabling the transistor Q3 to perform a source-follower operation in a similar manner, a drain of the transistor Q3 may be connected to a power supply terminal other than the second power supply terminal S2.

The voltage generating circuit 2 is composed of a resistance element R1, transistors Q1 and Q2 series-connected between the second power supply terminal S2 and the first power supply terminal S1. A gate of the transistor Q1 is connected to a drain (node N1) thereof, and a gate of the transistor Q2 is connected to a drain (node N2) thereof. That is, the transistors Q1 and Q2 individually constitute diode elements. A resistance value of the resistance element R1 is set to be much larger than conduction resistance values of the transistors Q1 and Q2 that are diode-connected. Consequently, the voltage of the node N1 that is the output end of the voltage generating circuit 2 is 2·Vth based on the reference potential (VSS). Note that in order to stabilize the potential of the node N1, a capacitance element may be connected between a constant potential source that provides a low impedance output and the node N1.

A potential of the gate (node N1) of the transistor Q3 is fixed at 2·Vth by the voltage generating circuit 2, and thus the transistor Q3 acts such that the node N3 is charged up to the potential Vth. That is, the transistor Q3 serves as a level shift element that shifts an output voltage of the voltage generating circuit 2 by a threshold voltage Vth of the transistor Q3. On the other hand, when a potential of the node N3 is higher than the input signal INS, the diode-connected transistor Q4 acts such that the voltage between the node N3 and the input signal INS is equal to the threshold voltage Vth. Thanks to the actions of those transistors Q3 and Q4, the charging/discharging circuit 1 functions so as to set the potential of the node N3 to Vth during a period when the input signal INS is at the L level (VSS).

The operation of the amplitude conversion circuit 10 is described with reference to a signal waveform diagram of FIG. 2. Before a time t0 of FIG. 2, the input signal INS is at the L level (VSS), whereas the input signal /INS is at the H level (VI). In this state, the transistor Q3 performs the source follower operation, and a potential V3 of the node N3 becomes lower than the potential 2·Vth of the node N1 by the threshold voltage Vth to be the potential Vth. On this occasion, the input signal INS is at the L level (VSS), and thus the source-gate voltage of the transistor Q4 is Vth. As a result, a current hardly flows through the transistor Q4.

Accordingly, the gate potential (V3) of the transistor Q5 is Vth. In addition, a source potential of the transistor Q5 is VI because the input signal /INS is at the H level, whereby the gate-source voltage of the transistor Q5 is Vth-VI. That is, the gate-source voltage of the transistor Q5 is lower than the threshold voltage Vth by VI, and the transistor Q5 turns off. Accordingly, the output terminal OUT is charged through the resistance element R2 to have the potential VDD. That is, the output signal /OUTS is at the H level.

When the input signal INS changes from the L level (VSS) to the H level (VI) at the time t0, a potential change of the input signal INS is transmitted to the node N3 by capacitive coupling via the capacitance element C1, whereby the potential V3 of the node N3 is boosted. Assuming that a capacitance value of the capacitance element C1 is much larger than a parasitic capacitance value of the node N3, the potential V3 of the node N3 rises by approximately the same amount as the amplitude of the input signal INS, and thus V3≈Vth+VI. The source-gate voltage of the transistor Q4 is Vth also on this occasion because the input signal INS is at the H level (VI), and thus a current hardly flows through the transistor Q4.

The input signal /INS that is a complementary signal of the input signal INS changes from the H level (VI) to the L level (VSS) at the time t0. The source potential of the transistor Q5 is VSS (=0 V), and thus the gate-source voltage of the transistor Q5 is Vth+VI. That is, the gate-source voltage of the transistor Q5 is higher than the threshold voltage Vth by VI, whereby the transistor Q5 turns on.

As described above, the resistance element R2 and the transistor Q5 constitute the ratio circuit, and the on-resistance value of the transistor Q5 is set to be much smaller than the resistance value of the resistance element R2. Accordingly, the output signal /OUTS changes from the H level to the L level (ratio circuit is inverted).

The on-resistance of the transistor Q5 can be adjusted by a gate width thereof. When the on-resistance value is reduced by increasing the gate width of the transistor Q5, the L level of the output signal /OUTS can be made lower (closer to VSS). At the same time, it is possible to change the output signal /OUTS to the L level using the input signals INS and /INS having a smaller amplitude (VI). It should be note that the parasitic capacitance of the drain (output terminal OUT) of the transistor Q5 and the drain-gate capacitance of the transistor Q5 increase when the gate width of the transistor Q5 is excessively increased, and hence a rising speed and a falling speed of the output signal /OUTS become slower.

After that, when the input signal INS changes from the H level (VI) to the L level (VSS) at a time t1, the potential of the node N3 drops by the amplitude VI of the input signal INS due to capacitive coupling via the capacitance element C1, to thereby become Vth. Further, on this occasion, the gate-source voltage of the transistor Q5 is Vth-VI because the input signal /INS changes from the L level (VSS) to the H level (VI), whereby the transistor Q5 turns off. As a result, the output terminal OUT is charged through the resistance element R2, and thus the output signal /OUTS reaches the H level (VDD). That is, the amplitude conversion circuit 10 returns to the state before the time t0.

In this manner, the level of the output signal /OUTS of the amplitude conversion circuit 10 changes with approximately the amplitude VDD in accordance with the level change of the input signal INS. That is, there is achieved amplitude conversion of converting the input signal INS having a small amplitude (VI) into a signal having an amplitude (VDD) larger than the amplitude (VI).

Here, attention is paid to the potential V3 of the gate (node N3) of the transistor Q5 in FIG. 2. As shown in FIG. 2, the potential of the node N3 is Vth when the input signal INS is at the L level (VSS), and is Vth+VI when the input signal INS is at the H level (VI). That is, the node N3 is supplied with a signal obtained by level-shifting the input signal INS by the same level as that of the threshold voltage Vth.

Further, in this preferred embodiment, the source of the transistor Q5 is supplied with the input signal /INS that is a complementary signal of the input signal INS. As a result, when the input signal INS is at the L level (VSS), the potential of the gate (node N3) of the transistor Q5 and the potential of the source (input terminal /IN) thereof are set to Vth and VI, respectively. Therefore, the gate-source voltage of the transistor Q5 is a value (Vth-VI) smaller than the threshold voltage, and the transistor Q5 turns off, with the result that the output signal /OUTS reaches the H level (VDD).

On the other hand, when the input signal INS reaches the H level (VI), the gate (node N3) of the transistor Q5 is boosted by the amplitude of the input signal INS, to thereby become Vth+VI. On the other hand, the potential of the source (input terminal /IN) of the transistor Q5 is VSS. Accordingly, the gate-source voltage of the transistor Q5 is a value (Vth+VI) larger than the threshold voltage, and the transistor Q5 turns on, with the result that the output signal /OUTS reaches the L level (VSS).

That is, the source-gate voltage of the transistor Q5 changes according to the level change of the input signal INS with the amplitude of 2·VI, with the threshold voltage Vth being the center. Accordingly, even when the amplitude VI of the input terminal IN is smaller than the threshold voltage Vth, the source-gate voltage of the transistor Q5 upon a change in level of the input signal INS inevitably crosses the threshold voltage Vth, whereby the transistor Q5 is switched between ON and OFF.

According to this preferred embodiment, therefore, the amplitude conversion circuit 10 can be operated normally using the input signal INS having the amplitude VI smaller than the threshold voltage Vth of the transistor Q5 (input transistor).

For example, the amplitude conversion circuit 10 is provided at an input stage of a drive circuit (threshold voltages of respective transistors in the circuit are 3 V to 5 V) of a display device, whereby it is possible to cause the drive circuit to operate normally using a control signal (having amplitude of 3.0 V to 3.3 V) generated in a semiconductor integrated circuit. The amplitude conversion circuit 10 according to this preferred embodiment is composed of only transistors having the same conductivity type, and thus can be easily formed on the same insulating substrate as pixels and drive circuit. As a result, an amplitude conversion circuit of a semiconductor integrated circuit is not required, and hence a part count of a display device can be reduced, which enables a cost reduction.

Hereinafter, various modifications of this preferred embodiment are described.

First Modification

Figure 3:
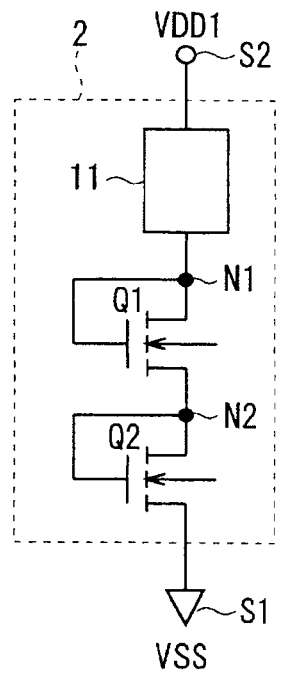
FIGS. 3 to 5 are circuit diagrams of a voltage generating circuit according to a first modification of the first preferred embodiment.

Here, a modification of the voltage generating circuit 2 included in the amplitude conversion circuit 10 is described. FIG. 3 is a diagram for describing a first modification of the first preferred embodiment, in which the resistance element R1 of the voltage generating circuit 2 shown in FIG. 1 is replaced with an appropriate current drive element 11.

Figure 4:
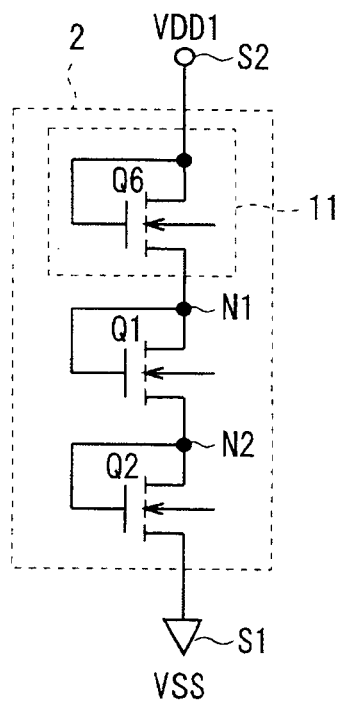
Figure 5:
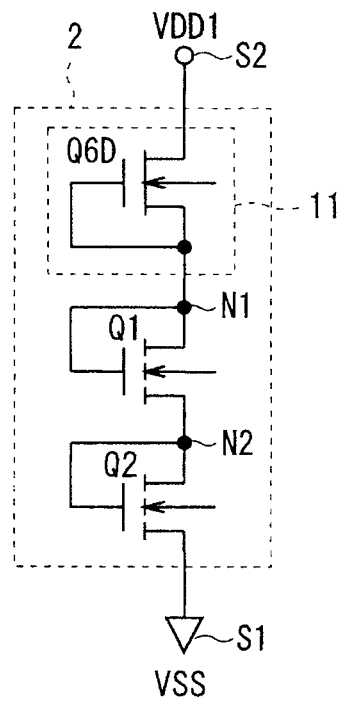

The resistance element R1 is used as the element that supplies a current to the node N1 in the voltage generating circuit 2 shown in FIG. 1, but not limited to a resistance element, and an appropriate current drive element 11 may be used. As the current drive element 11, a transistor Q6 having a gate connected to a drain as shown in FIG. 4 may be used, or a depletion type transistor Q6D having a gate connected to a source as shown in FIG. 5 may be used. The transistor Q6D of FIG. 5 functions as a constant current source, which makes the potential of the node N1 constant irrespective of the potential of the second power supply terminal S2.

Second Modification

Figure 6:
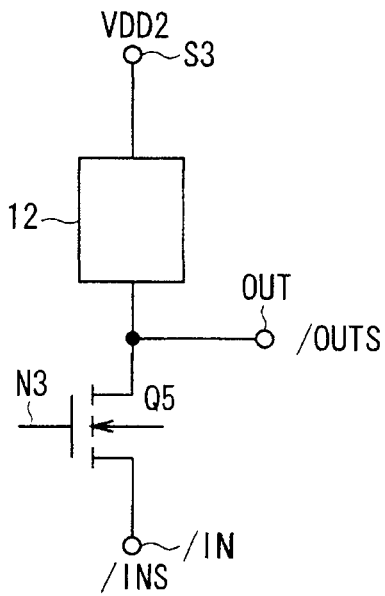

Here, a modification of an output stage of the amplitude conversion circuit 10 is described. FIG. 6 is a diagram for describing a second modification of the first preferred embodiment, in which the resistance element R2 at the output stage of the amplitude conversion circuit 10 shown in FIG. 1 is replaced with an appropriate current drive element 12.

The resistance element R2 is used as the element that supplies a current to the output terminal OUT, but not limited thereto, and an appropriate current drive element 12 may be used. As the current drive element 12, for example, bootstrap type load circuits shown in FIG. 7 and FIG. 8 may be used.

The bootstrap type load circuit shown in FIG. 7 is composed of transistors Q7 and Q8 and a capacitance element C2. The transistor Q7 is connected between the third power supply terminal S3 and the output terminal OUT. When a node to which a gate of the transistor Q7 is connected is defined as a "node N4", the transistor Q8 is connected between the third power supply terminal S3 and the node N4, and a gate thereof is connected to the third power supply terminal S3 (the transistor Q8 is diode-connected). The capacitance element C2 is connected between the node N4 and the output terminal OUT.

In the bootstrap type load circuit of FIG. 7, the node N4 is boosted by coupling via the capacitance element C2 when the output terminal OUT is charged by the transistor Q7. Accordingly, the transistor Q7 operates in a non-saturated region, which enables the potential of the output terminal OUT (output signal /OUTS) to rise to the same potential VDD as that of the third power supply terminal S3 without causing a loss by a threshold voltage amount.

The bootstrap type load circuit serving as the current drive circuit 12, which is shown in FIG. 8, is obtained by, in the circuit of FIG. 7, interposing a diode-connected transistor Q11 between the third power supply terminal S3 and the transistor Q7, and connecting a capacitance element C3 between the output terminal OUT and a connection node (defined as "node N7") between the transistors Q7 and Q11. In the current drive element 12, a connection node (defined as "node N6") between the current drive element 12 and the transistor Q5 does not serve as the output terminal OUT. The current drive element 12 is used in a case of driving other circuit that charges the output terminal OUT using a signal of the node N6 (for example, FIG. 13).

In the bootstrap type load circuit of FIG. 8, the transistor Q7 charges the node N6, and when the output terminal OUT is charged in accordance with this, the nodes N4 and N7 are boosted by coupling via the capacitance elements C2 and C3. As a result, the potentials of the gate and drain of the transistor Q7 become higher than the potential VDD of the third power supply terminal S3, and thus a rising speed of the signal of the node N6 becomes faster. This enables a rising speed of the output signal /OUTS to become faster as well.

Figure 9:
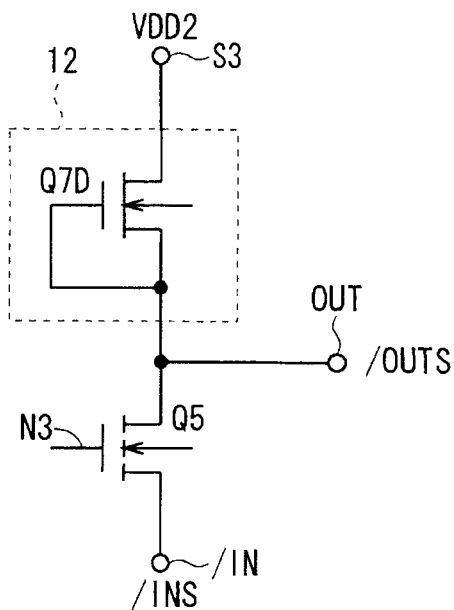

FIG. 9 shows an example in which a depletion type transistor Q7D, which is connected between the third power supply terminal S3 and the output terminal OUT and has a gate connected to a source (output terminal OUT), is used as the current drive element 12. In the current drive element 12, the transistor Q7D functions as a constant current source, and thus the current for charging the output terminal OUT becomes constant irrespective of the potential of the third power supply terminal S3. That is, a charging speed does not decrease in the course of charging the output terminal OUT, which makes rising of the output signal /OUTS faster.

Figure 10:
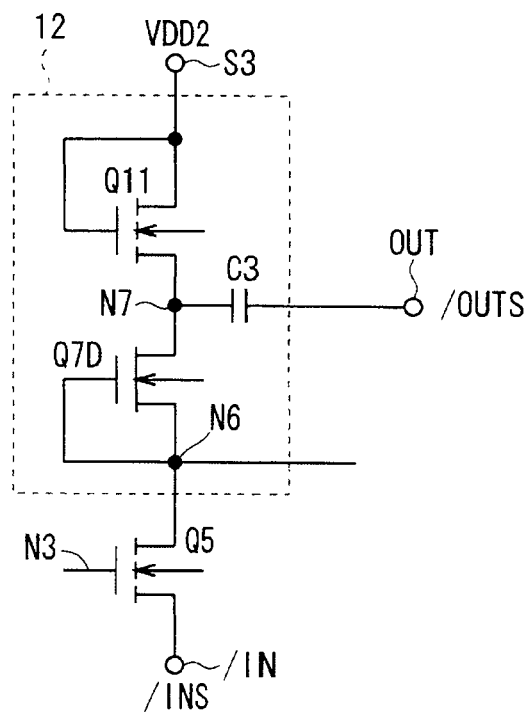

The current drive element 12 shown in FIG. 10 is a bootstrap type load circuit using the depletion type transistor Q7D. The bootstrap type load circuit is obtained by, in the circuit of FIG. 9, interposing the diode-connected transistor Q11 between the third power supply terminal S3 and the depletion type transistor Q7D, and connecting the capacitance element C3 between the output terminal OUT and the connection node (node N7) between the transistors Q7D and Q11. In the current drive element 12 of FIG. 10, as in the circuit of FIG. 8, the connection node (node N6) between the transistor Q5 and the current drive element 12 does not serve as the output terminal OUT. The current drive element 12 is used in a case of driving other circuit that charges the output terminal OUT using the signal of the node N6 (for example, FIG. 13).

In the bootstrap type load circuit of FIG. 10, the transistor Q7D charges the node N6, and when the output terminal OUT is charged in accordance with this, the node N7 is boosted by coupling via the capacitance element C3. As a result, the drain potential of the transistor Q7D becomes higher than the potential VDD of the third power supply terminal S3, and thus a rising speed of a signal of the node N6 becomes faster. This enables a rising speed of the output signal /OUTS to become faster as well.

The first and second modifications are applicable to every preferred embodiments and modifications described below. The following description mainly given of an example in which the voltage generating circuit 2 of FIG. 4 and the current drive element 12 of FIG. 7, which are employed with relative ease, are used.

Third Modification

Figure 11:
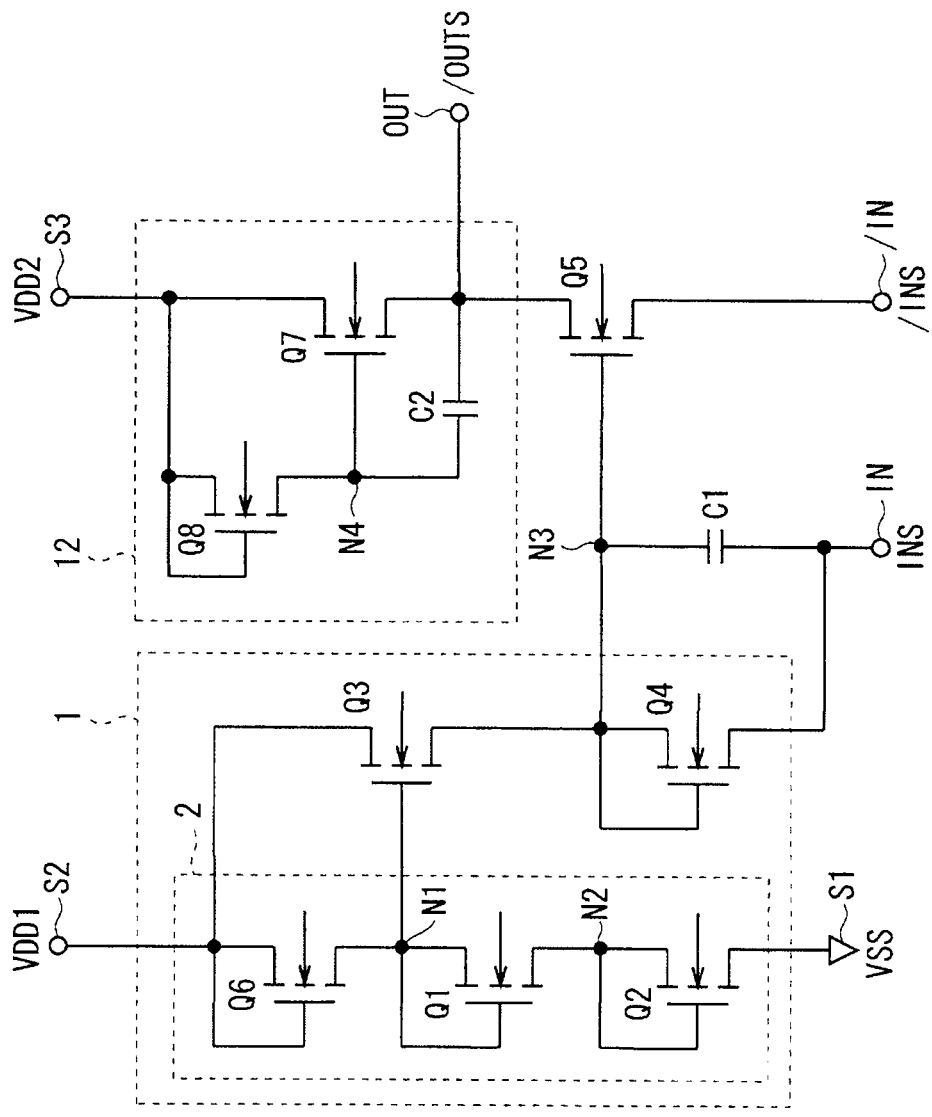
FIG. 11 is a circuit diagram of an amplitude conversion circuit according to a third modification of the first preferred embodiment.

FIG. 11 is a circuit diagram of an amplitude conversion circuit 10 according to a third modification of the first preferred embodiment. The amplitude conversion circuit 10 is obtained by, in the circuit of FIG. 1, employing the current drive element 11 (transistor Q6) of FIG. 4 in place of the resistance element R2, and employing the current drive element 12 (bootstrap type load circuit) of FIG. 7 in place of the resistance element R1.

The transistor Q6 that is the current drive element 11 has a gate connected to the second power supply terminal S2 together with a drain thereof, and thus operates in a saturated region. The gate of the transistor Q6 may be connected to a high-side power supply that differs from the second power supply terminal S2 as long as the transistor Q6 is capable of causing a predetermined current to flow. The gate length and the gate width of the transistor Q6 are set such that the current flowing through the transistor Q6 has the same value as the current flowing through the resistance element R1 of FIG. 1 when the output signal /OUTS is at the L level, whereby the potential of the node N1 can be set to be the same as in the case of FIG. 1. Current per unit area can be reduced compared with the case where the resistance element R1 is used, which enables a reduction in occupying area of the current drive element 11.

In the bootstrap type load circuit that is the current drive element 12, the gate length and the gate width of the transistor Q7 are set such that the current flowing through the transistor Q7 has the same value as that of the current flowing through the resistance element R2 of FIG. 1 when the output signal /OUTS is at the L level, whereby the L level potential of the output signal /OUTS can be made to be the same as that in the case of FIG. 1.

When the output signal /OUTS changes from the L level to the H level, the gate (node N4) of the transistor Q7 is boosted by coupling via the capacitance element C2. Assuming that the parasitic capacitance value of the node N4 is much smaller than the capacitance value of the capacitance element C2, the potential of the node N4 rises by the same amount of potential rise of the output terminal OUT. That is, the gate-source voltage of the transistor Q7 becomes constant irrespective of the voltage of the output terminal OUT.

In the case where the current drive element 12 is the resistance element R2 as in FIG. 1, the voltage applied across both ends of the resistance element R2 decreases along with a rise in potential of the output terminal OUT, and accordingly the current flowing therethrough reduces. Along with this, a rising speed of the output signal /OUTS decreases. In the case of the current drive element 12 (bootstrap type load circuit) of FIG. 11, the current flowing through the transistor Q7 is constant irrespective of the potential of the output terminal OUT, and thus compared with the case of FIG. 1, a rising speed of the output signal /OUTS becomes faster.

Fourth Modification

In the amplitude conversion circuit 10 of FIG. 11, for charging the load capacitance connected to the output terminal OUT at high speed, it is only required to increase the drive current (capability to cause a current to flow) of the transistor Q7 and to set the on-resistance of the transistor Q7 small. The transistors Q5 and Q7 of FIG. 11 constitute a ratio circuit, and thus in the case of reducing the on-resistance of the transistor Q7, the on-resistance of the transistor Q5 also needs to be reduced for keeping the L level potential of the output signal /OUTS low. In that case, however, the direct current flowing through the transistors Q5 and Q7 increases when the output signal /OUTS is caused to reach the L level, which incurs an increase in power consumption. This modification describes an amplitude conversion circuit 10 in which a measure against the above-mentioned problem is taken.

Figure 12:
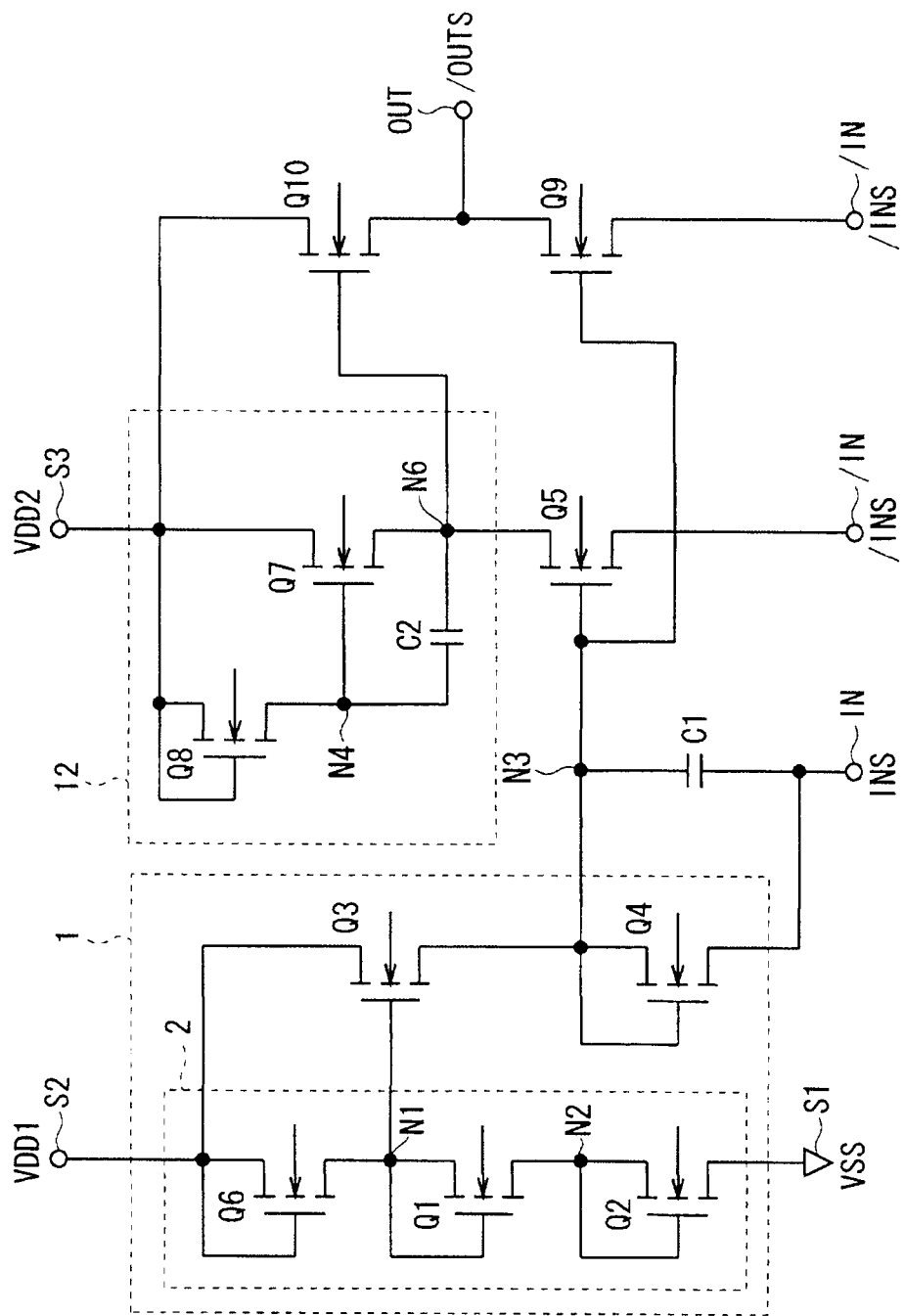
FIG. 12 is a circuit diagram of an amplitude conversion circuit according to a fourth modification of the first preferred embodiment.

FIG. 12 is a circuit diagram of the amplitude conversion circuit 10 according to a fourth modification of the first preferred embodiment. The amplitude conversion circuit 10 is obtained by, to the circuit of FIG. 11, providing a buffer circuit composed of transistors Q10 and Q9 at the output stage thereof. Although the output terminal OUT is provided at the connection node between the transistors Q7 and Q5 in the circuit of FIG. 11, the output end of the buffer circuit serves as the output terminal OUT in this modification.

The transistors Q10 and Q9 constituting the buffer circuit are connected in series between the third power supply terminal S3 and the input terminal /IN, and the output terminal OUT is provided at the connection node therebetween. The transistor Q10 is connected between the third power supply terminal S3 and the output terminal OUT and has a gate connected to a connection node (defined as "node N6") between the transistors Q7 and Q5. The transistor Q9 is connected between the output terminal OUT and the input terminal /IN and has a gate connected to the node N3.

The signal of the node N3 and the signal of the node N6 are complementary to each other, and thus the transistors Q10 and Q9 do not turn on at the same time. That is, the buffer circuit operates in a push-pull manner, whereby the direct current does not flow through the transistors Q10 and Q9 even when the output signal /OUTS is caused to reach the L level.

The load capacitance connected to the output terminal OUT is charged by the transistor Q10. Therefore, while the on-resistance of the transistor Q10 is required to made small for charging the load capacitance at high speed, the direct current does not flow between the transistors Q10 and Q9, and accordingly power consumption does not increase in that case. Note that the current drive element 12 (bootstrap type load circuit) according to this modification is not required to have high drive capability because it charges only the gate of the transistor Q10, and thus the on-resistance of the transistor Q7 is not required to be made higher. Therefore, it is possible to keep the direct current flowing through the transistors Q7 and Q5 small.

As described above, in the amplitude conversion circuit 10 according to this modification, power consumption in the current drive element 12 and the transistor Q5 can be curbed, and the power consumption in the buffer circuit composed of the transistors Q10 and Q9 is small because it operates in a push-pull manner. This contributes to a reduction in power consumption of the amplitude conversion circuit 10.

Fifth Modification

In the amplitude conversion circuit 10 according to the fourth modification (FIG. 12), the transistor Q10 performs a source-follower operation when the output signal /OUTS is at the H level. That is, the gate-source (output terminal OUT) voltage of the transistor Q10 decreases along with a rise in potential of the output signal /OUTS, and the drive capability of the transistor Q10 decreases, whereby the charging speed (rising speed of the output signal /OUTS) of the output terminal OUT becomes slower. In addition, the transistor Q10 operates in a saturated region, and thus a loss is caused by the amount of the threshold voltage Vth in charging the output terminal OUT, with the result that the H level potential of the output signal /OUTS becomes VDD−Vth. In this modification, description is given of a modification of an amplitude conversion circuit 10 capable of resolving this problem.

Figure 13:
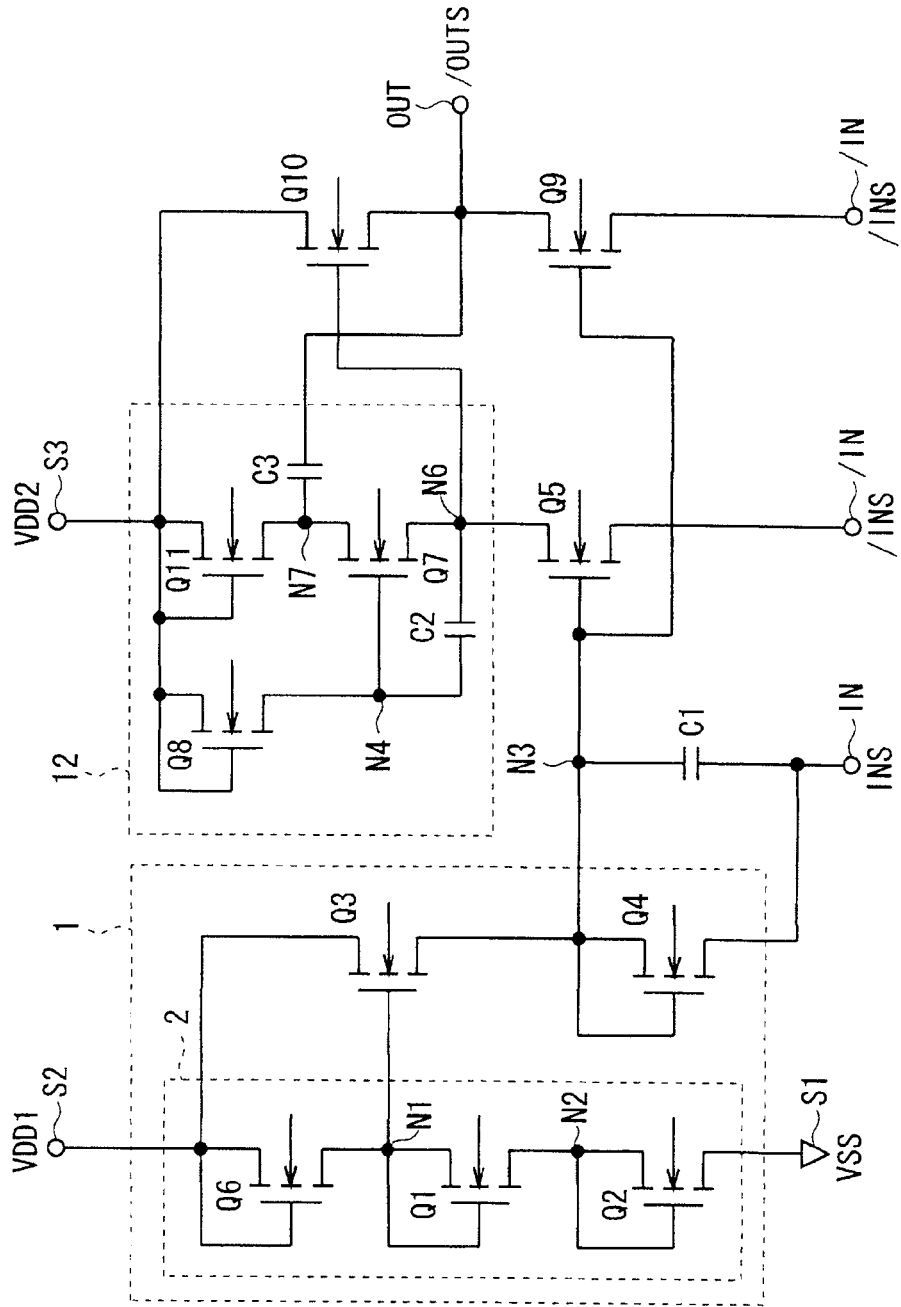
FIG. 13 is a circuit diagram of an amplitude conversion circuit according to a fifth modification of the first preferred embodiment.

FIG. 13 is a circuit diagram of the amplitude conversion circuit 10 according to a fifth modification of the first preferred embodiment. The amplitude conversion circuit 10 is obtained by applying the current drive element 12 of FIG. 8 to the circuit of FIG. 12. The capacitance element C3 of the current drive element 12 is connected between the node N7 and the output terminal OUT, which is different from FIG. 8 in that the output terminal OUT is not the connection node between the transistors Q7 and Q5 but the connection node (output end of the buffer circuit) between the transistors Q10 and Q9.

In the amplitude conversion circuit 10 of FIG. 13, when the input signal INS is at the H level, the transistor Q5 turns on, whereby the node N6 changes to the L level (≈VSS). At that time, the node N7 is charged by the transistor Q11, and the potential thereof is VDD−Vth. After that, when the input signal INS changes to the L level, the transistor Q5 turns off, whereby the node N6 changes to the H level. Correspondingly, the transistor Q10 turns on and the transistor Q9 turns off, which increases the potential of the output terminal OUT.

As a result of the rise in potential of the output terminal OUT, the node N7 is boosted by coupling via the capacitance element C3. The potential of the node N6 rises when the potential of the node N7 rises, and a decrease in drive capability of the transistor Q10 is avoided. Consequently, charging of the output terminal OUT is accelerated, and thus the node N7 is boosted further.

The above-mentioned positive feedback operation is repeated, whereby the potential of the node N7 rises up to approximately 2·VDD−Vth. Further, the transistor Q7 operates in a non-saturated region owing to the bootstrap action of the capacitance element C2, whereby the potential of the node N6 becomes approximately 2·VDD−Vth as well.

In the amplitude conversion circuit 10 of FIG. 13 as described above, when the transistor Q10 charges the output terminal OUT, the gate potential of the transistor Q10 rises along with this. Therefore, the transistor Q10 does not perform a source-follower operation, which prevents a decrease in rising speed of the output signal /OUTS. In addition, the transistor Q10 operates in a non-saturated region, whereby the H level potential of the output signal /OUTS rises up to VDD.

Figure 23:
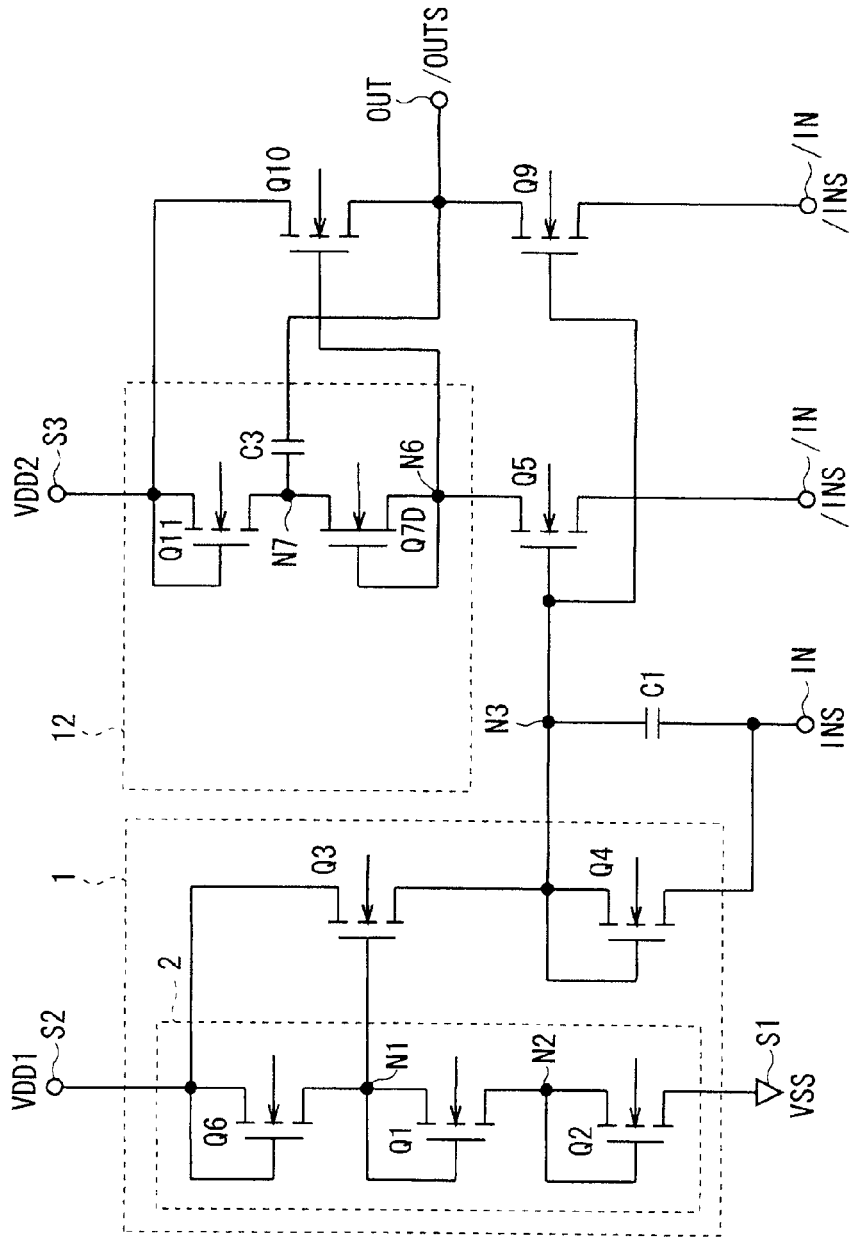
FIGS. 23 and 24 are circuit diagrams of the amplitude conversion circuit according to the fifth modification of the first preferred embodiment.
Figure 24:
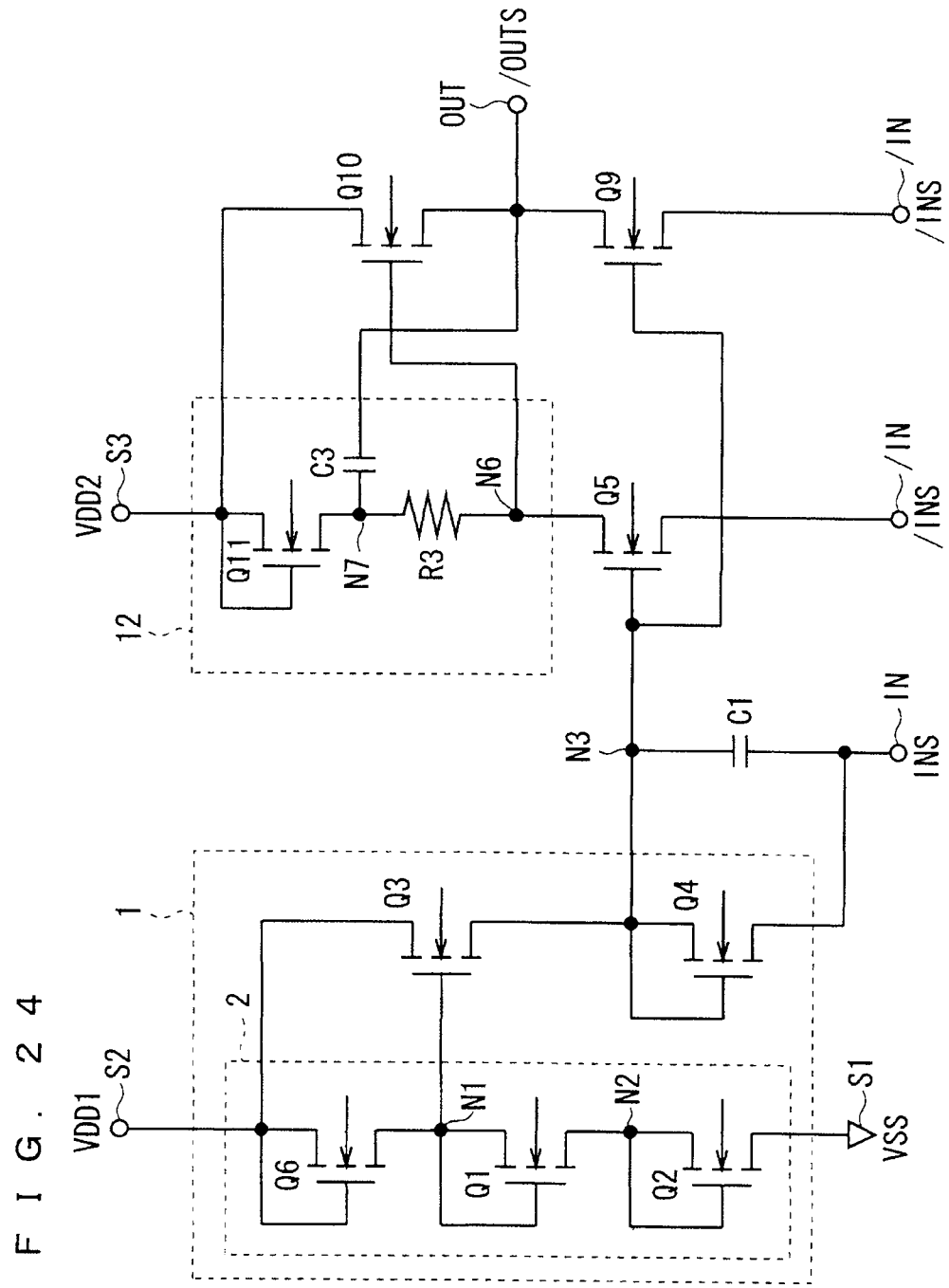

Although FIG. 13 shows an example in which the circuit of FIG. 8 is used as the current drive circuit 12, a similar effect is also obtained in a case of applying the current drive element 12 of FIG. 10 in which the depletion type transistor Q7D is used, as shown in FIG. 23. In the circuit of FIG. 23, the transistor Q7D may be replaced with a resistance element R3 (FIG. 24).

Sixth Modification

In a case where the load capacitance connected to the output terminal OUT is large, the rising speed of the output signal /OUTS decreases. In the amplitude conversion circuit 10 of FIG. 13, the rates of potential rise of the nodes N7 and N6 decrease when the rising speed of the output signal /OUTS decreases, whereby the rising speed of the output signal /OUTS decreases further. In this modification, description is given of a modification of the amplitude conversion circuit 10 capable of resolving this problem.

Figure 14:
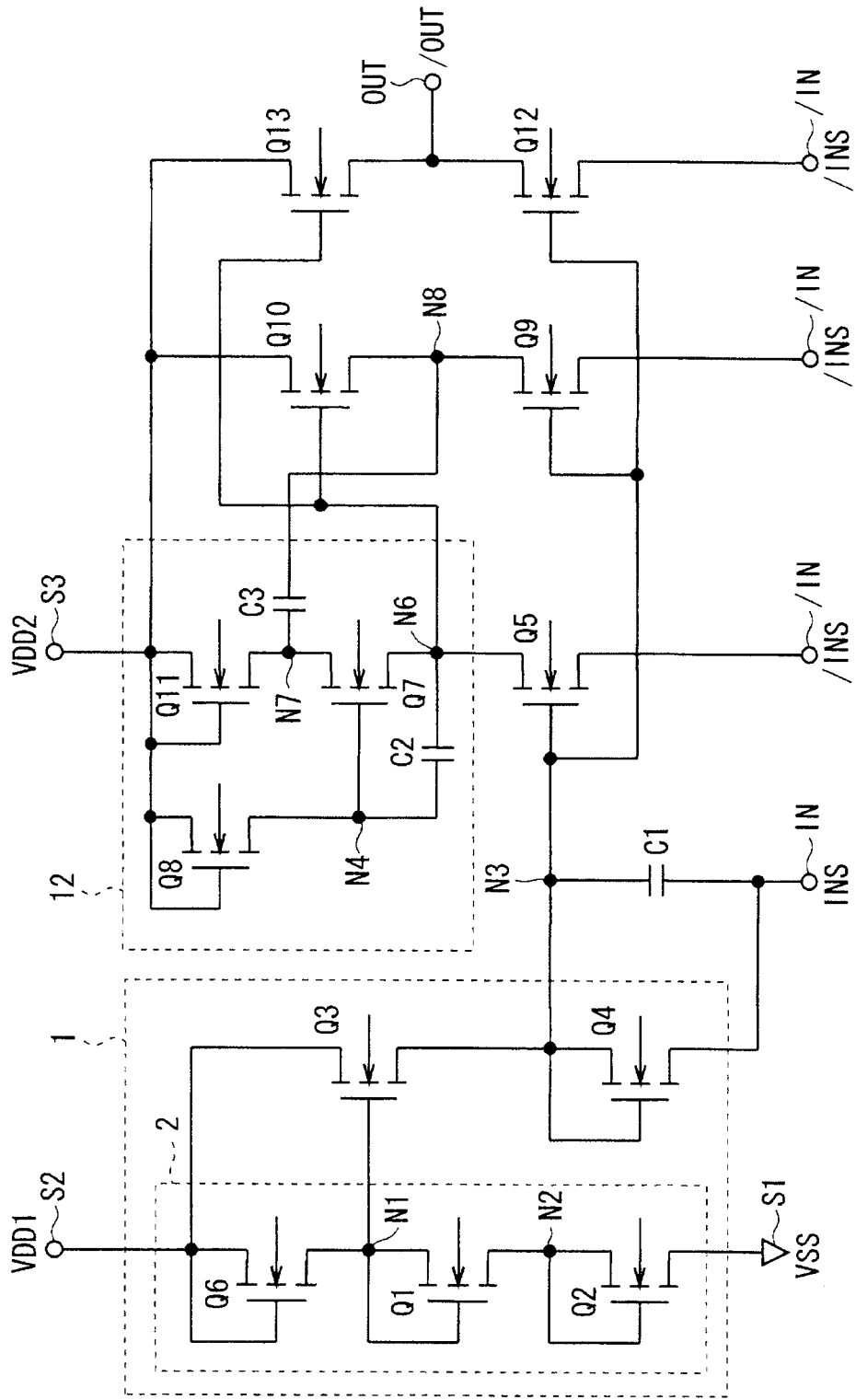
FIG. 14 is a circuit diagram of an amplitude conversion circuit according to a sixth modification of the first preferred embodiment.

FIG. 14 is a circuit diagram of the amplitude conversion circuit 10 according to a sixth modification of the first preferred embodiment. The amplitude conversion circuit 10 is obtained by providing, to the circuit of FIG. 13, another buffer circuit composed of transistors Q13 and Q12 in parallel with the buffer circuit composed of the transistors Q10 and Q9.

Although the output terminal OUT is provided at the output end of the buffer circuit composed of the transistors Q10 and Q9 in the circuit of FIG. 13, in this modification, the output terminal OUT is provided at the output end of the buffer circuit composed of the transistors Q13 and Q12. That is, the transistor Q13 is connected between the third power supply terminal S3 and the output terminal OUT and has a gate connected to the node N6. The transistor Q12 is connected between the output terminal OUT and the input terminal /IN and has a gate connected to the node N3. Note that the capacitance element C3 is connected between the node N7 and an output end (defined as "node N8") of the buffer circuit composed of the transistors Q10 and Q9 as in FIG. 13.

In the amplitude conversion circuit 10 of FIG. 14, the buffer circuit composed of the transistors Q13 and Q12 operates in a similar manner to the buffer circuit composed of the transistors Q10 and Q9, and thus a waveform of the output signal /OUTS is basically similar to that in the case of FIG. 13.

In FIG. 14, the buffer circuit composed of the transistors Q10 and Q9 is isolated from the output terminal OUT and exclusively operates to boost the node N7 through the capacitance element C3. Accordingly, the rates of potential rise of the nodes N7 and N6 do not depend on a volume of the load capacitance connected to the output terminal OUT. That is, even in the case of a large load capacitance, the rates of potential rise of the nodes N7 and N6 do not decrease, which resolves the above-mentioned problem.

Seventh Modification

The description above is given assuming a case where level change cycles of the input signals INS and /INS are relatively short.

In a case where the change cycles of the input signals INS and /INS are extremely long, it is conceivable that the potential (V3) of the node N3 boosted to Vth+VI by the capacitance element C1 when the input signal INS reaches the H level (VI) may drop to the potential Vth due to a leakage current. In such a case, the gate-source voltage of the transistor Q5 is equal to the threshold voltage Vth, whereby the transistor Q5 turns off, leading to a malfunction that the output signal /OUTS is inverted to the H level before the level of the input signal INS changes to the L level. In this modification, description is given of a modification of an amplitude conversion circuit 10 capable of resolving this problem.

Figure 15:
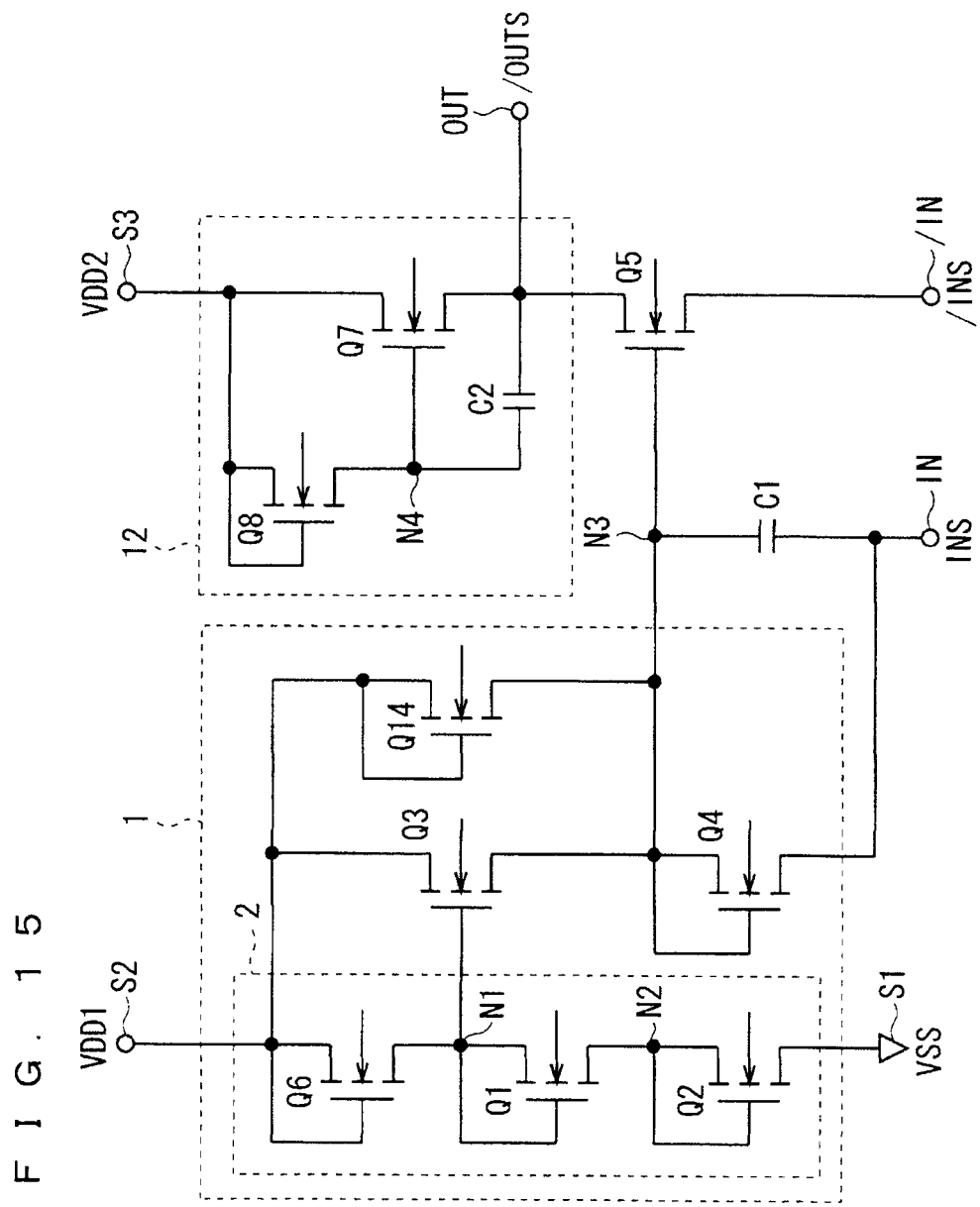
FIG. 15 is a circuit diagram of an amplitude conversion circuit according to a seventh modification of the first preferred embodiment.

FIG. 15 is a circuit diagram of the amplitude conversion circuit 10 according to a seventh modification of the first preferred embodiment. The amplitude conversion circuit 10 is obtained by providing, to the circuit of FIG. 13, a transistor Q14 serving as a current drive element for compensating for a leakage current of the node N3.

The transistor Q14 is connected between the second power supply terminal S2 and the node N3, and the drive capability thereof is set small (on-resistance is set high) to enable a flow of a minute current of such a degree that the leakage current generated in the node N3 is compensated. In FIG. 15, a gate of the transistors Q14 is connected to the second power supply terminal S2 (that is, the transistor Q14 is diode-connected), but may be connected to other power supply terminal as long as the transistor Q14 is capable of allowing the current for compensating the leakage current of the node N3 to flow.

According to this modification, the potential of the node N3 can be kept at VI+Vth for a long period of time when the input signal INS is at the H level, which resolves the above-mentioned problem of malfunction.

Note that while the node N3 should be kept at Vth while the input signal INS is at the L level, the transistor Q14 operates in the direction for raising the level of the node N3 from Vth for supplying a current also during that period. However, the transistor Q14 simply causes the minute current of the same degree of the leakage current to flow, and accordingly the node N3 hardly rises. In addition, the potential of the source (input terminal IN) of the transistor Q4 is VSS, whereby the transistor Q4 turns on to return the node N3 to Vth even if the node N3 rises from Vth. Therefore, a malfunction is prevented.

Here, while the description is given of the example in which the transistor Q14 is used as the current drive element for compensating for the leakage current of the node N3, a constant current source composed of a depletion type transistor or a resistance element may be used in place of the transistor Q14. Further, this modification is not limited to the application to the circuit of the FIG. 13 but is also applicable to the amplitude conversion circuits 10 according to the first preferred embodiment (FIG. 1), the third to sixth modifications (FIGS. 11 to 14, 23 and 24), eighth to tenth modifications described below (FIGS. 16 to 18), and further a second preferred embodiment (FIGS. 19 and 20).

Eighth Modification

As described above, in the amplitude conversion circuit 10 according to this preferred embodiment, when the gate width of the transistor Q5 that receives the input signal INS is increased, the following advantages are obtained. That is, the L level of the output signal /OUTS can be made lower (closer to VSS), and the output signal /OUTS can be changed to the L level using the input signals INS and /INS having a smaller amplitude (VI). At the same time, however, when the parasitic capacitance of the drain of the transistor Q5 and the drain-gate capacitance of the transistor Q5 are increased, the parasitic capacitance of the output terminal OUT is increased. As a result, the rate of potential rise of the drain (output terminal OUT) of the transistor Q5 drops, whereby the falling speed of the output signal /OUTS decreases. In this modification, description is given of an amplitude conversion circuit 10 capable of resolving this problem.

U.S. Pat. No. 4,048,518 discloses the technology of increasing the rising speed of the output signal of the inverter including MOS transistors. In this modification, the technology of U.S. Pat. No. 4,048,518 is applied to the amplitude conversion circuit 10.

FIG. 16 is a circuit diagram of the amplitude conversion circuit 10 according to an eighth modification of the first preferred embodiment. The amplitude conversion circuit 10 is obtained by providing transistors Q15 and Q16 to the circuit of FIG. 11. The transistor Q15 is connected between a source (defined as "node N8") of the transistor Q6 of the voltage generating circuit 2 and a drain (node N1) of the transistor Q1 thereof and has a gate connected to the node N8 (the transistor Q15 is diode-connected). In addition, the transistor Q16 is connected between the output terminal OUT and a drain (defined as "node N10") of the transistor Q5 and has a gate connected to the node N8.

The potential of the gate (node N8) of the transistor Q16 is fixed at 3·Vth. Assuming here that the amplitude VI of the input signal INS is equal to or less than the threshold voltage Vth of each transistor (VI≤Vth) as well, the potential of the node N8 is higher than the potential of the gate (node N3) of the transistor Q5 based on the reference potential (VSS) when the input signal INS is at the H level.

For this reason, if the transistors Q5 and Q16 have the same gate width, the transistor Q16 has a smaller on-resistance. That is, even when the gate width of the transistor Q16 is made smaller than the gate width of the transistor Q5, it is possible to obtain the on-resistance equal to that of the transistor Q5 in the transistor Q16. In this modification, the gate width of the transistor Q5 is set to be large for obtaining the above-mentioned advantage, whereas the gate width of the transistor Q16 is set to be smaller than the gate width of the transistor Q5.

In the amplitude conversion circuit 10 of FIG. 16, when the input signal INS is at the H level, the transistors Q5 and Q16 turn on and the node N10 and the output terminal are at the L level (≈VSS). Then, the transistor Q5 turns off when the input signal INS changes to the L level, whereby the node N10 and the output terminal OUT are charged by the current flowing through the transistor Q7.

The node N10 has a large parasitic capacitance because the gate width of the transistor Q5 is large, and thus its rate of potential rise is not fast. However, the gate potential of the transistor Q16 is 3·Vth, and accordingly the transistor Q16 turns off when the potential of the node N10 reaches 2·Vth, with the result that the node N10 is isolated from the output terminal OUT. The gate width of the transistor Q16 is small, and thus the rate of potential rise of the output terminal OUT increases after the node N10 is isolated from the output terminal OUT. As a result, the rising speed of the output signal /OUTS becomes faster compared with the case of FIG. 11.

As described above, according to this modification, it is possible to suppress a reduction in rising speed of the output signal /OUTS while obtaining the above-mentioned advantage thanks to the increased gate width of the transistor Q5.

Note that while FIG. 16 shows the case where one diode-connected transistor is provided between the node N8 and the node N1, two or more diode-connected transistors may be connected in series. In such a case, the gate width of the transistor Q16 can be made smaller because the potential of the gate (node N8) of the transistor Q16 is fixed at a higher value, which further reduces the parasitic capacitance of the output terminal OUT.

Note that the potential of the node N10 for causing the transistor Q16 to turn off becomes high when the potential of the node N8 is increased, and thus a longer period of time is required before the transistor Q16 turns off at the rising of the output signal /OUTS. As a result, the rising speed of the output signal /OUTS may become slower. Therefore, setting values of the gate width and the gate potential of the transistor Q16 need to be appropriately selected in consideration of the rising speed of the output signal /OUTS.

This modification is applicable to the first preferred embodiment (FIG. 1) and the third to sixth modifications (FIGS. 11 to 14, 23 and 24) described above.

Ninth Modification

As described above, in the amplitude conversion circuit 10 according to the eighth modification (FIG. 16), it is important to appropriately set the gate width and the gate potential of the transistor Q16. This is because when the potential of the node N8 is increased, the transistor Q16 is set to be small, but a longer period of time is required before the transistor Q16 turns off at the rising of the output signal /OUTS. In this modification, description is given of the modification capable of facilitating its setting.

FIG. 17 is a circuit diagram of an amplitude conversion circuit 10 according to a ninth modification of the first preferred embodiment. The amplitude conversion circuit 10 is obtained by providing, to the circuit of FIG. 16, a capacitance element C4 that is connected between the input terminal IN and the node N8 (gate of the transistor Q16).

In the amplitude conversion circuit 10 of FIG. 17, as a result of coupling through the capacitance element C4 when the input signal INS changes from the L level to the H level, the node N8 is boosted by the same voltage V1 as the amplitude of the input signal INS. Consequently, the on-resistance of the transistor Q16 when the output signal /OUTS is changed to the L level drops, whereby it is possible to set the gate width of the transistor Q16 smaller compared with the case of FIG. 16.

On the other hand, when the input signal INS changes from the H level to the L level, the node N8 is lowered by the capacitance element C4 by the voltage V1 and returns to the original potential 3·Vth. Accordingly, the transistor Q16 turns off when the node N10 reaches 2·Vth as in the case of FIG. 16.

As described above, in the amplitude conversion circuit 10 of FIG. 17, the node N8 is boosted at the time of falling of the output signal /OUTS. Accordingly, as in the case where the setting value of the potential of the node N8 is set high in the circuit of FIG. 16, there is obtained an effect that the gate width of the transistor Q16 can be set small. Further, the node N8 returns to the potential before boosting at the rising of the output signal /OUTS, which prevents an increase of the period of time before the transistor Q16 turns off. Accordingly, compared with the circuit of FIG. 16, the gate potential and the gate width of the transistor Q16 are set more easily.

This modification is applicable to the first preferred embodiment (FIG. 1) and the third to sixth modifications (FIGS. 11 to 14, 23 and 24) described above.

Tenth Modification

In each of the amplitude conversion circuits 10 described above, two input signals INS and /INS that are complementary to each other are used as input signals (externally input signals) externally supplied. As more externally input signals are used, a manufacturing cost of the device increases because it is required to provide input terminals and interconnections therefor.

FIG. 18 is a circuit diagram of an amplitude conversion circuit 10 according to a tenth modification of the first preferred embodiment. The amplitude conversion circuit 10 is obtained by connecting, in the circuit of FIG. 11, the source of the transistor Q5 to the first power supply terminal S1. As a result, the input terminal /IN supplied with the input signal /INS becomes unnecessary, whereby the input signal INS is solely supplied as the externally input signal.

In the amplitude conversion circuit 10 of FIG. 18, the source potential of the transistor Q5 is fixed at VSS. When the input signal INS is at the H level, as in the case of FIG. 11, the gate-source voltage of the transistor Q5 is Vth+VI, and the transistor Q5 turns on, whereby the output signal /OUTS changes to the L level. When the input signal INS is at the L level, the gate-source voltage of the transistor Q5 is the threshold voltage Vth, and the transistor Q5 substantially turns off. Accordingly, the output signal /OUTS changes to the H level. Note that the subthreshold current flows through the transistor Q5 on this occasion. That is, the transistor Q5 is in weak conduction, whereby the potential of the output signal /OUTS at the H level drops slightly compared with the case of FIG. 11 (VDD).

According to this modification, the number of externally input signals is reduced, which contributes to a reduction in manufacturing cost of the device. Note that the H level potential of the output signal /OUTS drops slightly, and thus this modification is desirably applied to the use in which a margin is sufficiently secured for the potential at the H level.

This modification is applicable to the first preferred embodiment (FIG. 1) and the third to sixth modifications (FIGS. 11 to 14, 23 and 24) described above.

Second Preferred Embodiment

For example, the output terminal OUT is discharged by the transistor Q5 in the circuit of FIG. 11. In a case where an amplitude of the input signal INS is small, while the gate-source voltage of the transistor Q5 in discharging the output terminal OUT does not rise to be excessively high, the transistor Q5 operates in a non-saturated region and the on-resistance thereof is set to be lower than that of the current drive element 12. Accordingly, it is possible to discharge the output terminal OUT at high speed.

On the other hand, in the circuit of FIG. 12 that includes the buffer circuit composed of the transistors Q10 and Q9, the output terminal OUT is discharged by the transistor Q9. The transistors Q10 and Q9 operate in a push-pull manner, and thus it is not required to set the on-resistance of the transistor Q9 (pulling element) to be smaller than that of the transistor Q10 (pushing element). Therefore, in the case where the amplitude of the input signal INS is small, the drive capability of the transistor Q9 drops. In particular, a larger load capacitance connected to the output terminal OUT incurs a decrease in falling speed of the output signal /OUTS. The second preferred embodiment proposes an amplitude conversion circuit 10 capable of resolving this problem.

FIG. 19 is a circuit diagram of the amplitude conversion circuit 10 according to the second preferred embodiment. The amplitude conversion circuit 10 includes two amplitude conversion circuits similar to the circuit of FIG. 11 and is configured such that two amplitude conversion circuits amplify the input signals INS and /INS to generate signals having an amplitude VDD that are complementary to each other, to thereby drive the buffer circuit for outputting the output signal /OUTS using the signals.

In FIG. 19, transistors Q1, Q2, Q3A, Q4A, Q5A, Q6, Q7A and Q8A and capacitance elements C1A and C2A constitute a first amplitude conversion circuit, which is similar to the circuit of FIG. 11. That is, the first amplitude conversion circuit outputs the signal obtained by inverting and amplifying the input signal INS to a node N6A between a current drive element 12A and the transistor Q5A.

On the other hand, the transistors Q1, Q2 and Q6 and transistors Q3B, Q4B, Q5B, Q7B and Q8B and capacitance elements C1B and C2B constitute a second amplitude conversion circuit, which is similar to the circuit of FIG. 11 (the first and second amplitude conversion circuits share a voltage generating circuit 2 composed of the transistors Q1, Q2 and Q6). Note that the signal complementary to the signal input to the first amplitude conversion circuit is input to the second amplitude conversion circuit. That is, one end of the capacitance element C1B of the second amplitude conversion circuit is supplied with the input signal /INS, and a source of the transistor Q5B is supplied with the input signal INS. Accordingly, in the second amplitude conversion circuit, a signal obtained by inverting and amplifying the input signal /INS (complementary signal of the input signal INS) is output to a node N6B between a current drive element 12B and the transistor Q5B.

The output signal /OUTS is generated using a buffer circuit composed of a transistor Q17 that is controlled by an output signal (signal of the node N6A) of the first amplitude conversion circuit and a transistor Q18 that is controlled by an output signal (signal of the node N6B) of the second amplitude conversion circuit. The transistor Q17 is connected between a third power supply terminal S3 and the output terminal OUT and has a gate connected to the node N6A. The transistor Q18 is connected between the output terminal OUT and a first power supply terminal S1 and has a gate connected to the node N6B.

In the amplitude conversion circuit 10 of FIG. 19, the signal of the node N6A and the signal of the node N6B are complementary to each other, and thus the buffer circuit composed of the transistors Q17 and Q18 operates in a push-pull manner. Further, even in a case where the amplitude of the input signal INS is small, a gate of the transistor Q18 that discharges the output terminal OUT is supplied with a signal having a large amplitude (VDD), and thus the drive capability of the transistor Q18 is kept high. Accordingly, it is possible to prevent a drop of the falling speed of the output signal /OUTS while obtaining the effect of reducing power consumption due to the generation of the output signal /OUTS using the buffer circuit.

Note that in this preferred embodiment, the potential of the signal of the node N6 is VSS at the L level and VDD at the H level, and thus the source of the transistor Q18 is fixed at the potential VSS. However, similarly to the transistor Q9 of the buffer circuit of FIG. 12, the source of the transistor Q18 may be supplied with the input signal /INS.

Modification

While the circuit of FIG. 11 is used as the first and second amplitude conversion circuits constituting the amplitude conversion circuit 10 in FIG. 19, the respective circuits described in the first preferred embodiment and modifications thereof are also applicable.

For example, FIG. 20 shows an example in which the circuit of FIG. 13 (fifth modification of the first preferred embodiment) is applied as the first conversion circuit. Note that while the output end of the circuit of FIG. 13 is the connection node (node N8) between the transistors Q10 and Q9, in this case, the signal of the node N6A between the current drive element 12A and the transistor Q5A is supplied to the gate of the transistor Q17.

As is apparent from the description of the fifth modification of the first preferred embodiment, the H level potential of the signal of the node N6A rises up to approximately 2·VDD−Vth. This causes the transistor Q17 to operate in non-saturation when charging the output terminal OUT, and thus the H level potential of the output signal /OUTS can be caused to rise up to VDD.

Further, in the circuit of FIG. 20, the output terminal OUT and a node N8 are isolated from each other, and accordingly there is obtained an effect similar to that of the sixth modification (FIG. 14) of the first preferred embodiment. That is, even in a case where a capacitance value of a load capacitance connected to the output terminal OUT is large, the rate of potential rise of the node N6A does not drop by an influence thereof, and a decrease in rising speed of the output terminal OUT can be controlled.

Third Preferred Embodiment

In a third preferred embodiment, the amplitude conversion circuit having a similar function to that of the first preferred embodiment is composed of p-type transistors.

Figure 21:
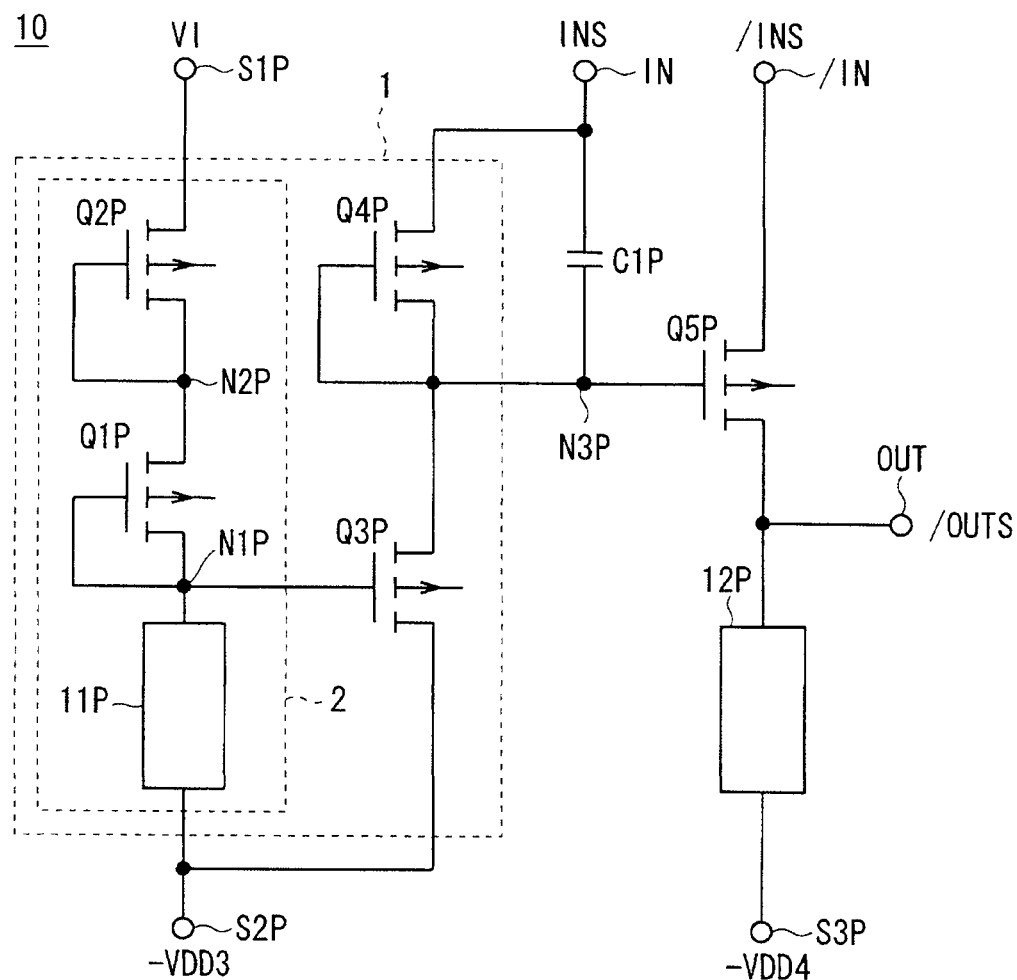
FIG. 21 is a circuit diagram of an amplitude conversion circuit according to a third preferred embodiment.

FIG. 21 is a circuit diagram of an amplitude conversion circuit 10 according to the third preferred embodiment. The amplitude conversion circuit 10 is obtained by configuring the circuit that function in a similar manner to the circuit of FIG. 1 with p-type transistors. That is, the circuit of FIG. 21 is obtained by, in the circuit of FIG. 1, replacing the n-type transistors with p-type transistors and inverting voltage polarities of the power supply voltage and signals (active level is L level, whereas inactive level is H level).

In FIG. 21, respective elements corresponding to those of FIG. 1 are denoted by adding reference symbol "P" to the same reference numerals. Note that in FIG. 21, elements corresponding the resistance elements R1 and R2 of FIG. 1 are replaced with current drive elements 11P and 12P.

In addition, also in this preferred embodiment, it is assumed that threshold voltages of all transistors constituting the amplitude conversion circuit 10 are equal to each other, and that a value thereof is Vthp. A threshold voltage Vthp of the p-type transistor is a negative value.

On the other hand, in a semiconductor integrated circuit that generates the input signals INS and /INS, a positive power supply is typically used with the ground potential (VSS=0) being a reference potential. Accordingly, also in this preferred embodiment, the L level of the input signals INS and /INS is the ground potential and the H level thereof is the positive potential. As in the first preferred embodiment, it is assumed here that the L level potential of the input terminals IN and /IN is VSS (=0) and the H level potential thereof is VI (>0).

In the circuit using p-type transistors, the reference potential of the circuit is set to be equal to or smaller than the H level potential of the signal to be input. FIG. 21 shows an example of the amplitude conversion circuit 10 in which the reference potential is made to be equal to the H level potential (VI) of the input signals INS and /INS. Accordingly, a first power supply terminal S1P serving as a reference power supply terminal is supplied with the potential VI as the high-side power supply potential. Further, a second power supply terminal S2P and a third power supply terminal S3P are supplied with negative potentials −VDD3 and −VDD4, respectively, as the low-side power supply potential for activating the amplitude conversion circuit 10. The potentials −VDD3 and −VDD4 may be equal to each other.

In a case where the semiconductor integrated circuit that generates the input signals INS and /INS is classified into a type that regards the ground potential as the reference potential and is driven using a negative power supply (−VI), the H level potential of the input signals INS and /INS is VSS (=0) and the L level potential thereof is −VI. In that case, the reference potential of FIG. 21, that is, the potential supplied to the first power supply terminal S1P is set to VSS.

The potential of a node N1P that becomes an output voltage of the voltage generating circuit 2 is set by the current flowing through the current drive element 11P. When on-resistance values of the transistors Q2P and Q3P are set to be much smaller than the resistance value of the current drive element 11P, the level of the node N1P is the voltage obtained by reducing an amount of the threshold voltage of the transistors Q2P and Q3P from the potential VI of the first power supply terminal S1P, VI−2·|Vthp|. |Vthp| represents an absolute value of the threshold voltage of the p-type transistor.

Figure 22:
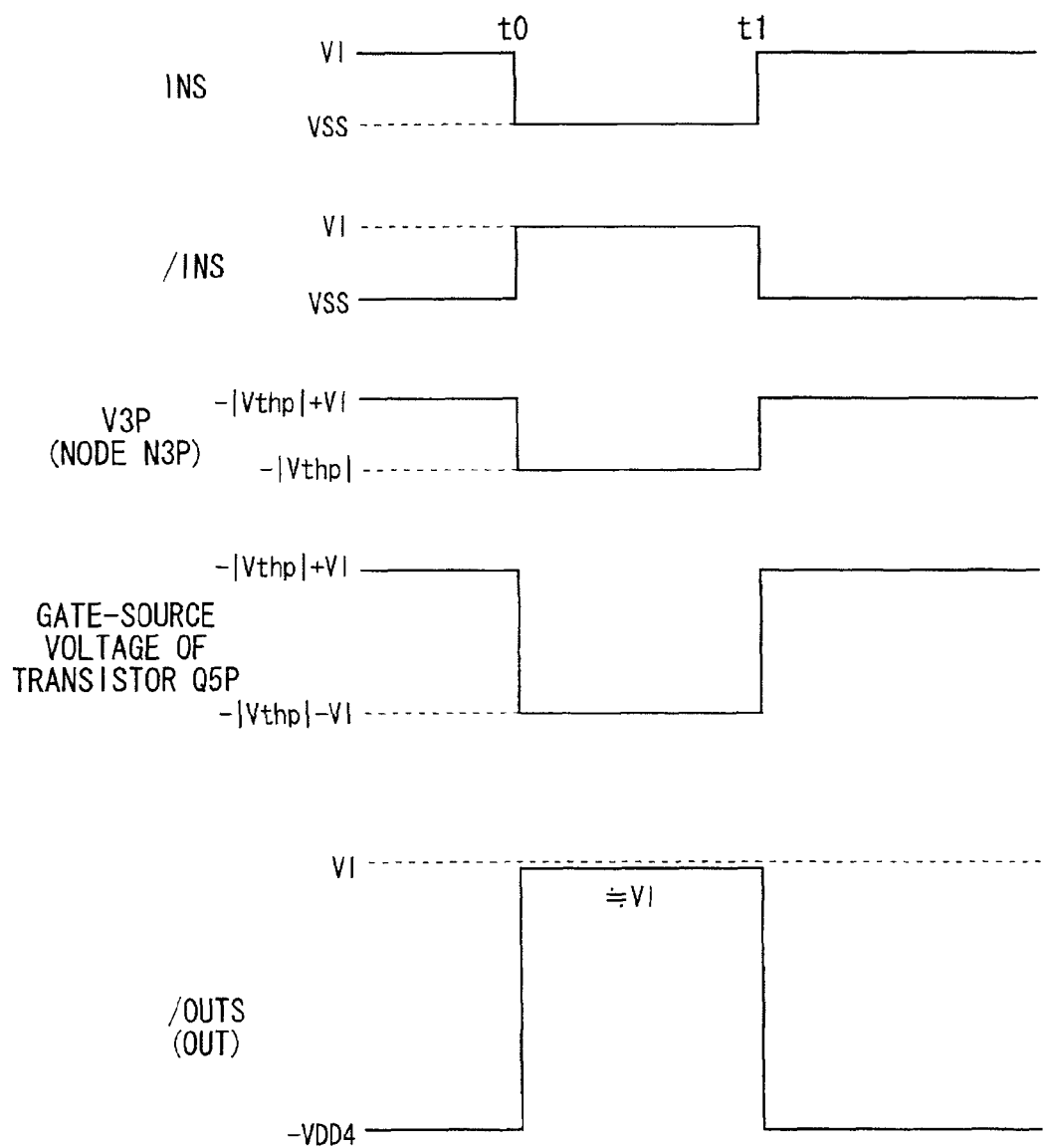
FIG. 22 is a signal waveform diagram showing an operation of the amplitude conversion circuit according to the third preferred embodiment.

An operation of the amplitude conversion circuit 10 of FIG. 21 is described with reference to a signal waveform diagram of FIG. 22. Before a time t0 of FIG. 22, the input signal INS is at the H level (VI), whereas the input signal /INS is at the L level Vthp that is higher than the potential VI−2·|Vthp| of the node N1P by the threshold voltage Vthp. The input signal INS is at the H level (VI) on this occasion, and thus a source-gate voltage of a transistor Q4P is −|Vthp|. Accordingly, the current hardly flows through the transistor Q4P.

Therefore, a gate potential (V3P) of a transistor Q5P is −|Vthp|+VI. In addition, the input signal /INS is at the L level, and thus a source potential of the transistor Q5P is VSS. That is, the gate-source voltage of the transistor Q5P is −|Vthp|+VI. In other words, the gate-source voltage of the transistor Q5P is higher than the threshold voltage −|Vthp| by VI, whereby the transistor Q5P turns off. As a result, the output terminal OUT is charged through the current drive element 12P to the potential −VDD4. That is, the output signal /OUTS is at the L level.

When the input signal INS changes from the H level (VI) to the L level (VSS) at the time t0, a potential change of the input signal INS is transmitted to the node N3P by capacitive coupling via the capacitance element C1P, whereby the potential V3P of the node N3P is lowered. Assuming that a capacitance value of the capacitance element C1P is much larger than a parasitic capacitance value of the node N3P, the potential V3P of the node N3P drops by approximately the same amount of the amplitude of the input signal INS such that V3P≈−|Vthp|.

The input signal /INS that is complementary to the input signal INS changes from the L level (VSS) to the H level (VI) at the time t0. As a result, the source potential of the transistor Q5P is VI, and thus the gate-source voltage of the transistor Q5P is −|Vthp|−VI. That is, the gate-source voltage of the transistor Q5P becomes lower than the threshold voltage −|Vthp| by VI, whereby the transistor Q5P turns on.

The current drive element 12P and the transistor Q5P constitute a ratio circuit. An on-resistance value of the transistor Q5P is set to be much smaller than a resistance value of the current drive element 12P, which changes the output signal /OUTS from the L level to the H level (inverts the ratio circuit).

After that, the input signal INS changes from the L level (VSS) to the H level (VI) at a time t1, and accordingly the potential of the node N3P becomes higher by the amplitude VI of the input signal INS through coupling via the capacitance element C1P such that −|Vthp|+VI. Further, the input signal /INS changes from the H level (VI) to the L level (VSS) on this occasion, and thus the gate-source voltage of the transistor Q5P is −|Vthp|+VI. Consequently, the transistor Q5P turns off. As a result, the output terminal OUT is charged through the current drive element 12P, whereby the output signal /OUTS changes to the L level (VDD). That is, the amplitude conversion circuit 10 returns to the above-mentioned state before the time t0.

As described above, the level of the output signal /OUTS of the amplitude conversion circuit 10 changes in accordance with a level change of the input signal INS. That is, there is achieved amplitude conversion in which the input signal INS having a small amplitude (VI) is converted into a signal having a larger amplitude (VI+|−VDD|).

As described above, it is possible to configure the amplitude conversion circuit 10 according to the present invention with p-type transistors. The amplitude conversion circuit 10 can be caused to operate normally with the use of the input signal INS having a smaller amplitude compared with the threshold voltage Vthp of the transistor Q5P (input transistor). In addition, the amplitude conversion circuit 10 is configured only with p-type transistors, and accordingly can be formed with ease on the same insulating substrate as the pixels and drive circuits composed of p-type transistors as well. As a result, an amplitude conversion circuit of semiconductor integrated circuit is not required, which reduces a part count of a display device, enabling a cost reduction.

This preferred embodiment is applicable to the every amplitude conversion circuits that have the configurations described in the first and second preferred embodiments and the modifications thereof above.

While the invention has been shown and described in detail, the foregoing description is in all aspects illustrative and not restrictive. It is therefore understood that numerous modifications and variations can be devised without departing from the scope of the invention.

What is claimed is:

1. An amplitude conversion circuit converting a first signal into a second signal having a larger amplitude than that of said first signal, the circuit comprising:
a first input terminal receiving said first signal;
an output terminal for outputting said second signal;
a first current drive element including at least one transistor charging said output terminal, the first current drive element connected between a first power supply terminal and said output terminal;
a first transistor discharging said output terminal; and
a drive circuit driving said first transistor in response to said first signal, wherein
said drive circuit level-shifts the first signal by a level substantially equal to a threshold voltage of said first transistor, and supplies the level-shifted first signal to a first node to which a control electrode of said first transistor is connected,
all transistors included in the amplitude conversion circuit are of the same conductivity type, and
the amplitude conversion circuit further comprising a third current drive element connected between a fourth power supply terminal and said first node for compensating a leakage current at the first node.

2. The amplitude conversion circuit according to claim 1, wherein said drive circuit comprises:
a charging/discharging circuit causing said first node to have a voltage substantially equal to the threshold voltage of said first transistor based on a reference potential during an inactive period of said first signal; and
a capacitance element connected between said first input terminal and said first node.

3. The amplitude conversion circuit according to claim 2, wherein said charging/discharging circuit comprises:
a voltage generating circuit generating a voltage substantially twice the threshold voltage of said first transistor based on the reference potential;
a level shift element shifting the voltage generated by said voltage generating circuit to a voltage smaller by the threshold voltage of said first transistor, and supplying the shifted voltage to said first node; and
a first diode element connected in parallel with said capacitance element.

4. The amplitude conversion circuit according to claim 3, wherein said first diode element is a second transistor including a control electrode connected to said first node.

5. The amplitude conversion circuit according to claim 3, wherein said voltage generating circuit comprises:
a second current drive element connected between a second power supply terminal and a second node to which said voltage substantially twice the threshold voltage of said first transistor based on the reference potential is output; and
second and third diode elements series-connected between said second node and a reference power supply terminal.

6. The amplitude conversion circuit according to claim 5, wherein said second current drive element is a first resistance element.

7. The amplitude conversion circuit according to claim 5, wherein said second current drive element is a third transistor including a control electrode supplied with a constant voltage.

8. The amplitude conversion circuit according to claim 7, wherein said third transistor is a depletion type transistor including a control electrode connected to said second node.

9. The amplitude conversion circuit according to claim 5, wherein each of said second and third diode elements is a diode-connected transistor.

10. The amplitude conversion circuit according to claim 5, wherein said first power supply terminal and said second power supply terminal have the same potential.

11. The amplitude conversion circuit according to claim 5, wherein said level shift element is a fourth transistor including a control electrode receiving the voltage generated by said voltage generating circuit and connected between a third power supply terminal and said first node.

12. The amplitude conversion circuit according to claim 11, wherein said second power supply terminal and said third power supply terminal have the same potential.

13. The amplitude conversion circuit according to claim 1, wherein said first current drive element is a bootstrap type load circuit including a fifth transistor connected between said first power supply terminal and said output terminal, said fifth transistor including a control electrode boosted along with charging of said output terminal.

14. The amplitude conversion circuit according to claim 1, wherein said first current drive element is a depletion type sixth transistor including a control electrode connected to said output terminal and connected between said first power supply terminal and said output terminal.

15. The amplitude conversion circuit according to claim 1, further comprising a second input terminal receiving a complementary signal of said first signal, wherein
said first transistor is connected between said output terminal and said second input terminal.

16. The amplitude conversion circuit according to claim 1, wherein said first transistor is connected between said output terminal and a reference power supply terminal.

17. The amplitude conversion circuit according to claim 1, wherein the amplitude conversion circuit is formed on a same substrate as pixels and a drive circuit of a display device.

18. An amplitude conversion circuit converting a first signal into a second signal having a larger amplitude than that of said first signal, the circuit comprising:
a first input terminal receiving said first signal;
an output terminal for outputting said second signal;
a first current drive element including at least one transistor charging said output terminal, the first current drive element connected between a first power supply terminal and said output terminal;
a first transistor discharging said output terminal; and
a drive circuit driving said first transistor in response to said first signal, wherein
said drive circuit level-shifts the first signal by a level substantially equal to a threshold voltage of said first transistor, and supplies the level-shifted first signal to a first node to which a control electrode of said first transistor is connected,
all transistors included in the amplitude conversion circuit are of the same conductivity type,
the amplitude conversion circuit further comprising a seventh transistor interposed between said output terminal and said first transistor, and
a control electrode of said seventh transistor is set to have a voltage larger than a voltage of said first node based on a reference potential when said first node is boosted in accordance with activation of said first signal.

19. An amplitude conversion circuit converting a first signal into a second signal having a larger amplitude than that of said first signal, the circuit comprising:

a first amplitude conversion circuit converting said first signal into a first internal signal having a larger amplitude than that of said first signal;

a second amplitude conversion circuit converting a complementary signal of said first signal into a second internal signal having a larger amplitude than that of said complementary signal;

a first transistor controlled by one of said first and second internal signals and connected between a second output terminal for outputting the second signal and a first power supply terminal; and a second transistor controlled by the other of said first and second internal signals and connected between said second output terminal and a second power supply terminal, wherein each of said first and second amplitude conversion circuits includes a first input terminal receiving the first signal or the complementary signal of the first signal, an output terminal for outputting the first internal signal or the second internal signal, a first current drive element including at least one transistor charging said output terminal, the first current drive element connected between the first power supply terminal and said output terminal, a third transistor discharging said output terminal, and a drive circuit driving said first transistor in response to the first signal or the complementary signal of the first signal, wherein said drive circuit level-shifts the first signal or the complementary signal of the first signal by a level substantially equal to a threshold voltage of said third transistor, and supplies the level-shifted first signal or the level-shifted complementary signal of the first signal to a first node to which a control electrode of said third transistor is connected, all transistors included in the first and second amplitude conversion circuits are of the same conductivity type.

20. The amplitude conversion circuit according to claim 19, wherein the amplitude conversion circuit is formed on a same substrate as pixels and a drive circuit of a display device.

* * * * *